(12) United States Patent
Okutsu et al.

(10) Patent No.: US 8,633,571 B2
(45) Date of Patent: Jan. 21, 2014

(54) SEMICONDUCTOR DEVICE AND TEST METHOD

(75) Inventors: Akihiko Okutsu, Yokohama (JP); Hitoshi Saito, Hachioji (JP); Yoshiaki Okano, Itabashi (JP)

(73) Assignee: Fujitsu Semiconductor Limited, Yokohama (JP)

( * ) Notice: Subject to any disclaimer, the term of this patent is extended or adjusted under 35 U.S.C. 154(b) by 40 days.

(21) Appl. No.: 13/482,146

(22) Filed: May 29, 2012

(65) Prior Publication Data

US 2013/0015587 A1 Jan. 17, 2013

(30) Foreign Application Priority Data

Jul. 11, 2011 (JP) ................................ 2011-153273

(51) Int. Cl.
*H01L 23/544* (2006.01)
*H01L 29/66* (2006.01)

(52) U.S. Cl.
USPC ............................ 257/620; 257/409; 257/484

(58) Field of Classification Search
USPC ........................... 257/409, 484, 620, 758, 773
See application file for complete search history.

(56) References Cited

U.S. PATENT DOCUMENTS

| | | | | |
|---|---|---|---|---|
| 6,022,791 | A * | 2/2000 | Cook et al. ...................... | 438/458 |
| 6,492,247 | B1 * | 12/2002 | Guthrie et al. ................. | 438/460 |
| 6,879,020 | B2 * | 4/2005 | Yamaguchi .................... | 257/529 |
| 7,098,676 | B2 * | 8/2006 | Landers et al. ................ | 324/716 |
| 7,667,279 | B2 * | 2/2010 | Nakashiba .................... | 257/409 |
| 7,790,577 | B2 * | 9/2010 | Liu et al. ........................ | 438/462 |
| 7,948,039 | B2 * | 5/2011 | Tsutsue et al. ................. | 257/409 |
| 8,169,080 | B2 * | 5/2012 | Morimoto et al. ............. | 257/758 |
| 8,274,080 | B2 * | 9/2012 | Han ................................ | 257/48 |
| 2004/0245598 | A1 | 12/2004 | Yamaguchi | |
| 2005/0098893 | A1 | 5/2005 | Tsutsue et al. | |
| 2007/0102787 | A1 * | 5/2007 | Goebel et al. ................. | 257/532 |
| 2009/0121322 | A1 * | 5/2009 | Ozawa .......................... | 257/620 |
| 2010/0012950 | A1 * | 1/2010 | Liu et al. ........................ | 257/77 |
| 2010/0013043 | A1 * | 1/2010 | Liu et al. ........................ | 257/491 |
| 2011/0037140 | A1 * | 2/2011 | Tan et al. ...................... | 257/506 |
| 2012/0286397 | A1 * | 11/2012 | Kuechenmeister et al. .. | 257/620 |

FOREIGN PATENT DOCUMENTS

| | | | |
|---|---|---|---|
| JP | 2003-203913 A | 7/2003 | |
| JP | 2004-363217 A | 12/2004 | |
| JP | 2005-167198 A | 6/2005 | |

* cited by examiner

*Primary Examiner* — David Zarneke
(74) *Attorney, Agent, or Firm* — Westerman, Hattori, Daniels & Adrian, LLP

(57) ABSTRACT

A semiconductor device includes a semiconductor substrate including an element region, an inner sealing and an outer sealing which are formed on the element region and have a first opening part and a second opening part, respectively, a multilayer interconnection structure which is formed on the substrate and stacks multiple inter-layer insulation films each including a wiring layer, a moisture resistant film formed between a first inter-layer insulation film and a second inter-layer insulation film which are included in the multilayer interconnection structure, a first portion which extended from a first side of the moisture resistant film and passes the first opening part, a second portion which extended from a second side of the moisture resistant film and passes through the second opening part, and a wiring pattern including a via plug which penetrates the moisture resistant film and connects the first portion and the second portion.

8 Claims, 33 Drawing Sheets

SEMICONDUCTOR DEVICE AND TEST METHOD

CROSS-REFERENCE TO RELATED APPLICATIONS

This patent application is based upon and claims the benefit of priority of the prior Japanese Patent Application No. 2011-153273 filed on Jul. 11, 2011, the entire contents of which are incorporated herein by reference.

FIELD

The embodiments discussed herein are related to a semiconductor device and a test method thereof.

BACKGROUND

Various semiconductor devices or electronic devices using semiconductor chips are realized. Conventionally, the semiconductor devices or the electronic devices are mounted by individually bonding semiconductor chips implementing a flip chip on a circuit substrate.

Moreover, conventionally, the semiconductor chips are individually formed on independent chip areas. After that, the semiconductor chips are separated from each other and are used separately.

On the other hand, in a recent semiconductor device or electronic device, a remarkably complicated function or a higher performance is desired. Thus, instead of a semiconductor chip only including a single internal circuit, that is, a single core, there is proposed a semiconductor device or an electronic device having a so-called multi-core configuration for combining and using multiple internal circuit or multi-cores.

On the other hand, in a multi-core semiconductor device having a configuration in which the multi-cores are formed on a single semiconductor substrate, it is desired to cut the semiconductor substrate into two or more divisions, which form small scaled multi-core semiconductor devices, as needed.

In the multi-core semiconductor device, the multi-cores formed on the semiconductor substrate are wired. When the semiconductor substrate is divided, problems may occur in which moisture infiltrates into or a crack may extend to one or more cores along a wiring pattern from a cut plane.

PATENT DOCUMENTS

Japanese Laid-open Patent Publication No. 2005-167198
Japanese Laid-open Patent Publication No. 2003-203913
Japanese Laid-open Patent Publication No. 2004-363217

SUMMARY

According to one aspect of the embodiment, there is provided a semiconductor device including a semiconductor substrate configured to include an element region; an inner sealing configured to be formed on the element region, and to include a first opening part; an outer sealing configured to be formed on the element region, and to include a second opening part; a multilayer interconnection structure configured to be formed on the semiconductor substrate and to stack multiple inter-layer insulation films each including a wiring layer; a moisture resistant film configured to be formed between a first insulation film and a second insulation film formed above the first insulation film, in which the first insulation film and the second insulation film are included in the multilayer interconnection structure; and a wiring pattern configured to include a first portion, a second portion, and a via plug, wherein the first portion extends at a first side corresponding to either one of a bottom side and a top side of the moisture resistant film, and passes the first opening part; the second portion extends at a second side corresponding to another one of the bottom side and the top side of the moisture resistant film, and passes through the second opening part; and the via plug penetrates the moisture resistant film and connects the first portion and the second portion.

According to another aspect of the embodiment, there is provided a semiconductor device including a semiconductor substrate on which at least a first element region and a second element region are formed; a first outer sealing and a first inner sealing configured to be formed on the first element region; a second outer sealing and a second inner sealing configured to be formed on the second element region; a first core region configured to be surrounded by the first inner sealing in the first element region; a second core region configured to be surrounded by the second inner sealing in the second element region; and a multilayer interconnection structure configured to be formed by a laminate which stacks multiple inter-layer insulation films extending from the first element region to the second element region on the semiconductor substrate, each of the multiple inter-layer insulation films including a wiring layer; wherein the multilayer interconnection structure includes a first multilayer interconnection structure portion on the first element region and a second multilayer interconnection structure portion on the second element region; the first multilayer interconnection structure portion includes the first outer sealing and the first inner sealing which are formed outside the first core region; the second multilayer interconnection structure portion includes the second outer sealing and the second inner sealing which are formed outside the second core region; the wiring layer forms the first outer sealing and the first inner sealing in the first multilayer interconnection structure portion; the wiring layer forms the second outer sealing and the second inner sealing in the second multilayer interconnection structure portion; the multilayer interconnection structure includes a moisture resistant film extending from the first element region to the second element region; and a mutual connection wiring pattern extends by sequentially crossing the first inner sealing, the first outer sealing, the second outer sealing, and the second inner sealing from the first core region, wherein the mutual connection wiring pattern includes: a first portion in which either one of a bottom side and a top side of the moisture resistant film extends from the first core region to a first sealing region between the first inner sealing and the first outer sealing; a second portion in which either one of the bottom side and the top side of the moisture resistant film extends from the first sealing region to a second sealing region between the second outer sealing and the second inner sealing; and a third portion in which the first side of the moisture resistant film extends from the second sealing region to the second core region, wherein the first portion and the second portion of the mutual connection wiring pattern are connected by a first via plug penetrating the moisture resistant film in the first sealing region, and the second portion and the third portion of the mutual connection wiring pattern are connected by a second via plug penetrating the moisture resistant film in the second sealing region.

According to another aspect of the embodiment, there is provided a test method for testing a semiconductor device which includes a semiconductor substrate on which at least a first element region to form a first internal circuit and a second element region to form a second internal circuit are formed; a first outer sealing and a first inner sealing configured to be formed on the first element region; a second outer sealing and a second inner sealing configured to be formed on the second element region; a first core region configured to be surrounded by the first inner sealing in the first element region; a second core region configured to be surrounded by the second inner sealing in the second element region; and a multilayer interconnection structure configured to be formed by a laminate which stacks multiple inter-layer insulation films extending from the first element region to the second element region on the semiconductor substrate, each of the multiple inter-layer insulation films including a wiring layer; wherein the multilayer interconnection structure includes a first multilayer interconnection structure portion on the first element region and a second multilayer interconnection structure portion on the second element region; the first multilayer interconnection structure portion includes the first outer sealing and the first inner sealing which are formed outside the first core region; the second multilayer interconnection structure portion includes the second outer sealing and the second inner sealing which are formed outside the second core region; the wiring layer forms the first outer sealing and the first inner sealing in the first multilayer interconnection structure portion; the wiring layer forms the second outer sealing and the second inner sealing in the second multilayer interconnection structure portion; the multilayer interconnection structure includes a moisture resistant film extending from the first element region to the second element region; and a mutual connection wiring pattern extends by sequentially crossing the first inner sealing, the first outer sealing, the second outer sealing, and the second inner sealing from the first core region, wherein the mutual connection wiring pattern includes: a first portion in which either one of a bottom side and a top side of the moisture resistant film extends from the first core region to a first sealing region between the first inner sealing and the first outer sealing; a second portion in which either one of the bottom side and the top side of the moisture resistant film extends from the first sealing region to a second sealing region between the second outer sealing and the second inner sealing; and a third portion in which the first side of the moisture resistant film extends from the second sealing region to the second core region, wherein the first portion and the second portion of the mutual connection wiring pattern are connected by a first via plug penetrating the moisture resistant film in the first sealing region, and the second portion and the third portion of the mutual connection wiring pattern are connected by a second via plug penetrating the moisture resistant film in the second sealing region, wherein the test method is performed in a state in which at least the first internal circuit and the second internal circuit are tested in a state in which the first internal circuit and the second internal circuit are formed on the semiconductor substrate, by contacting a probe to the electrode test pad.

DESCRIPTION OF EMBODIMENTS

First Embodiment

Figure 1A:
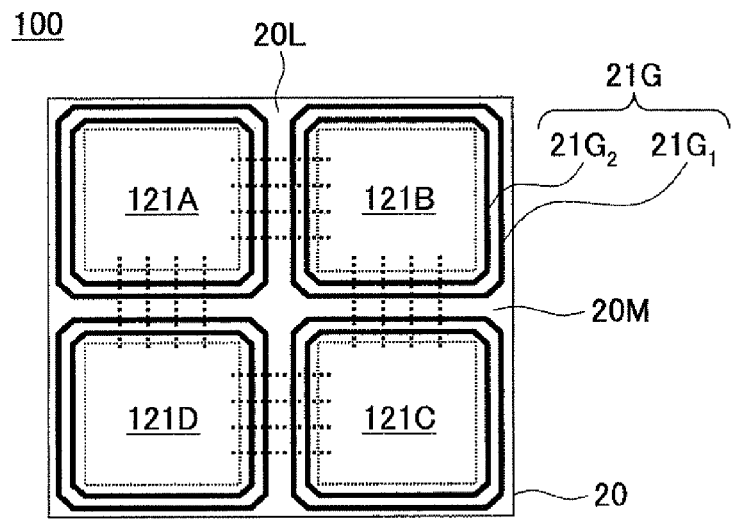
FIG. 1A is a plan view briefly illustrating a multi-core semiconductor device as an example of a first embodiment.

In the following, embodiments of the present invention will be described with reference to the accompanying drawings. FIG. 1A is a plan view illustrating the entire configuration of a semiconductor device 100 according to a first embodiment.

Figure 1B:
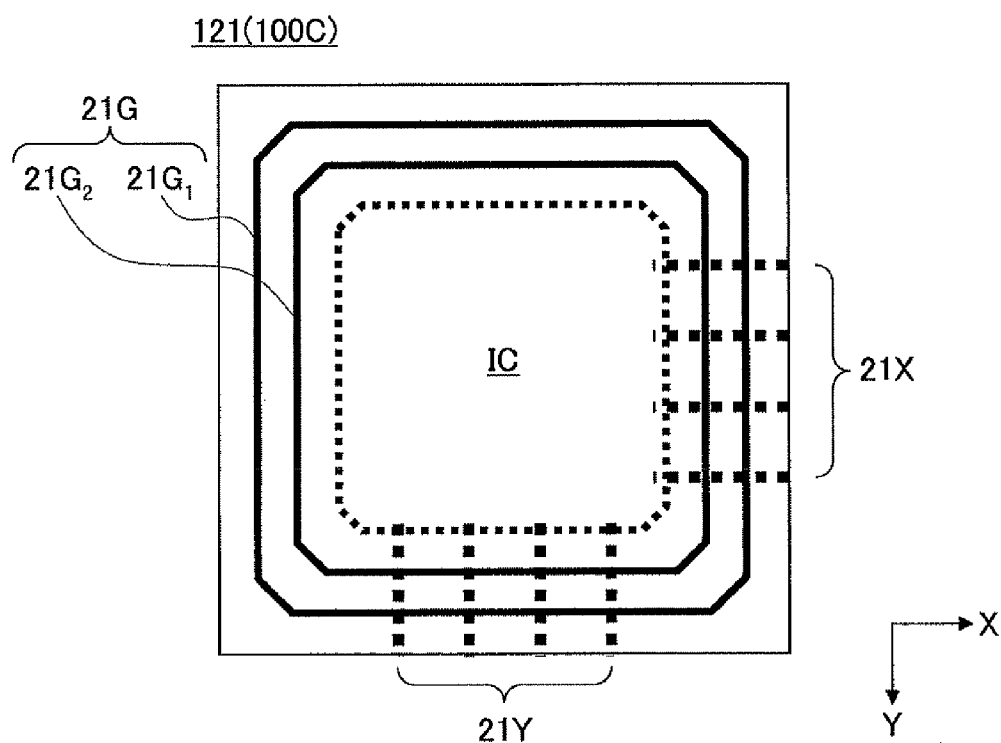
FIG. 1B is a plan view illustrating an example of a single core semiconductor device formed by dividing the multi-core semiconductor device in FIG. 1A.

Referring to FIG. 1A, the semiconductor device 100 forms a multi-core semiconductor device in which multiple element regions 121 each as illustrated in FIG. 1B are arranged adjacent to each other. Referring to FIG. 1B, each of the element regions 121 includes a double sealing system 21G formed by an external sealing $21G_1$ and an internal sealing $21G_2$ inside the external sealing $21G_1$, and an internal circuit (core) IC formed by being surrounded by the double sealing system 21G on a silicon substrate 20 of a single semiconductor chip. The internal circuit IC is depicted by a dotted line. In an example illustrated in FIG. 1A, element regions 121A to 121D, each corresponding to the element region 121 in FIG. 1B, are formed on the silicon substrate 20 of the semiconductor chip. Also, in the semiconductor device 100, the element regions 121A to 121D are mutually and electrically connected by a wiring portion 21X extending a X direction and a wiring portion 21Y extending a Y direction over the double sealing system 21G. The wiring portions 21X and 21Y are depicted by dotted lines in FIG. 1B.

Figure 2:
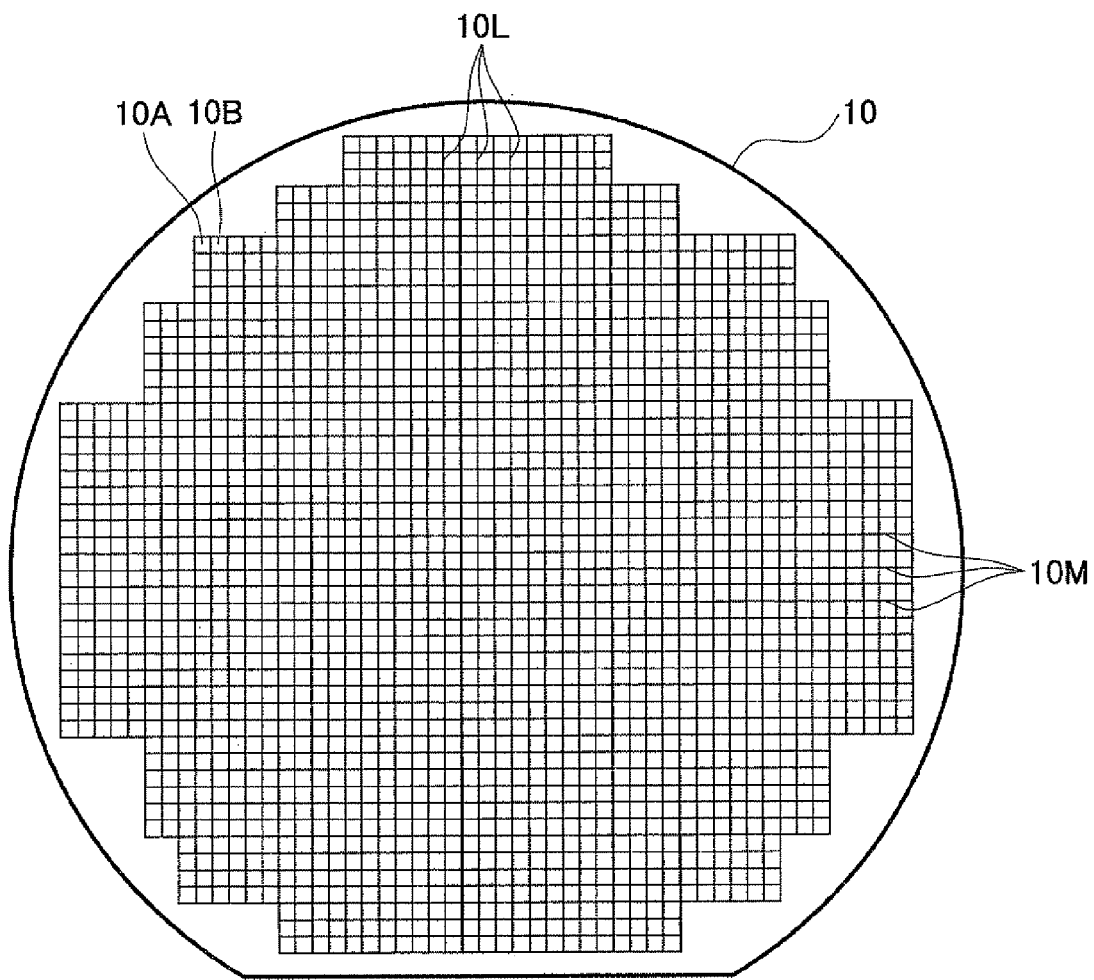
FIG. 2 is a plan view illustrating a semiconductor wafer on which a plurality of semiconductor devices in FIG. 1A or FIG. 1B, and chip regions on the semiconductor wafer.

The element regions 121 (including the element regions 121A to 121D) respectively correspond to chip regions 10A, 10B, ... which are defined by scribe lines 10L and 10M on a semiconductor wafer 10 illustrated in FIG. 2. Accordingly, in the semiconductor device 100 in FIG. 1A, space regions 20L and 20M are formed corresponding to the scribe lines 10L and 10M among the element regions 121A to 121D.

In the first embodiment, the internal circuit IC in the element region 121 in FIG. 1B or in each of the element regions 121A to 121D is formed so as to independently operate. Accordingly, as illustrated in FIG. 2, by cutting the semiconductor device 100 in FIG. 1A at the space regions 20L and 20M, it is possible to form the semiconductor device 100B having a dual core configuration. By cutting the semiconductor device 100B in FIG. 3 along the space region 20L, it is possible to form the element region 121 in FIG. 1B to be a semiconductor device 100C having a single core configuration which independently operates.

Figure 3:
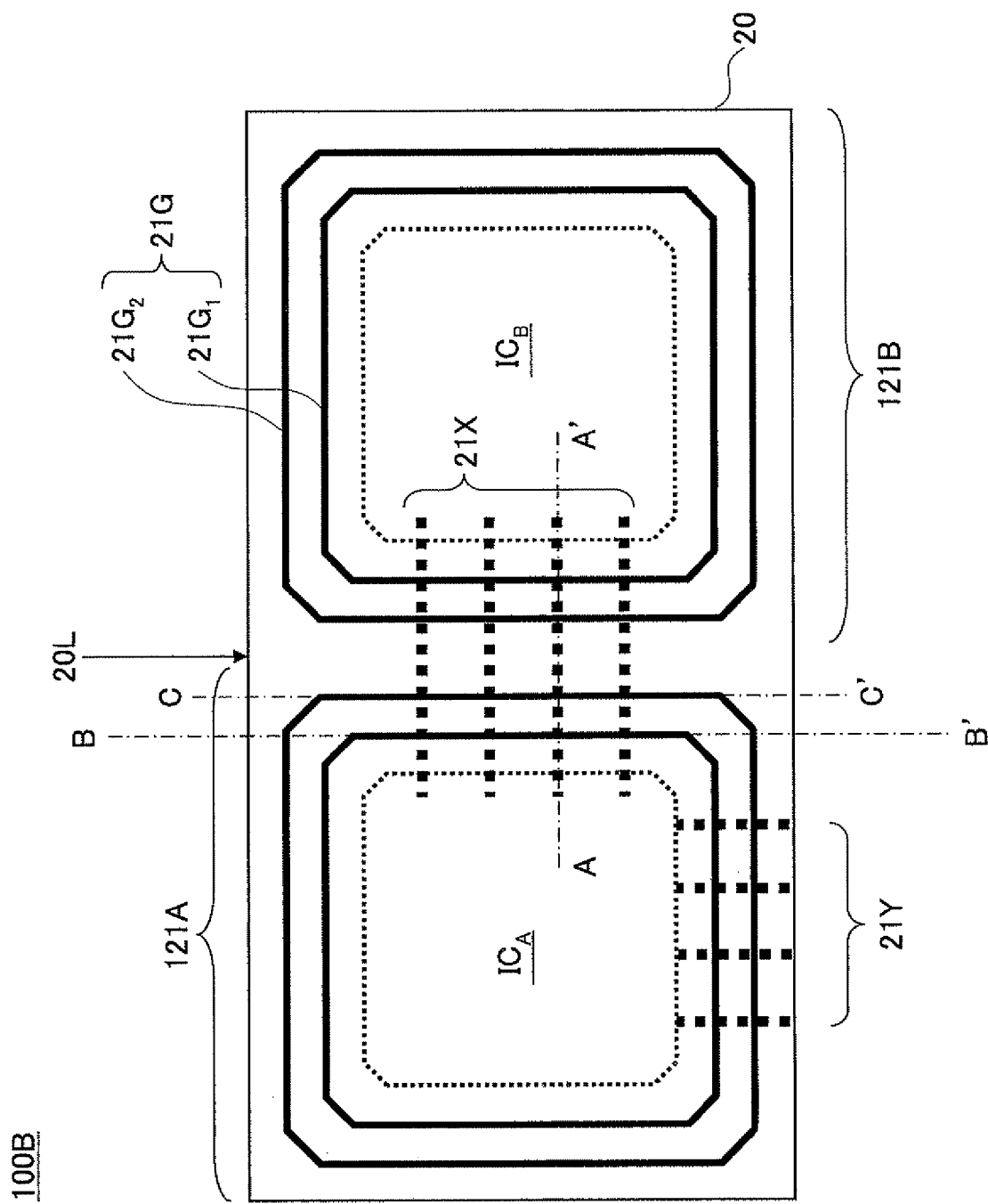
FIG. 3 is a plan view illustrating a configuration of the semiconductor device according to the first embodiment.
Figure 4:
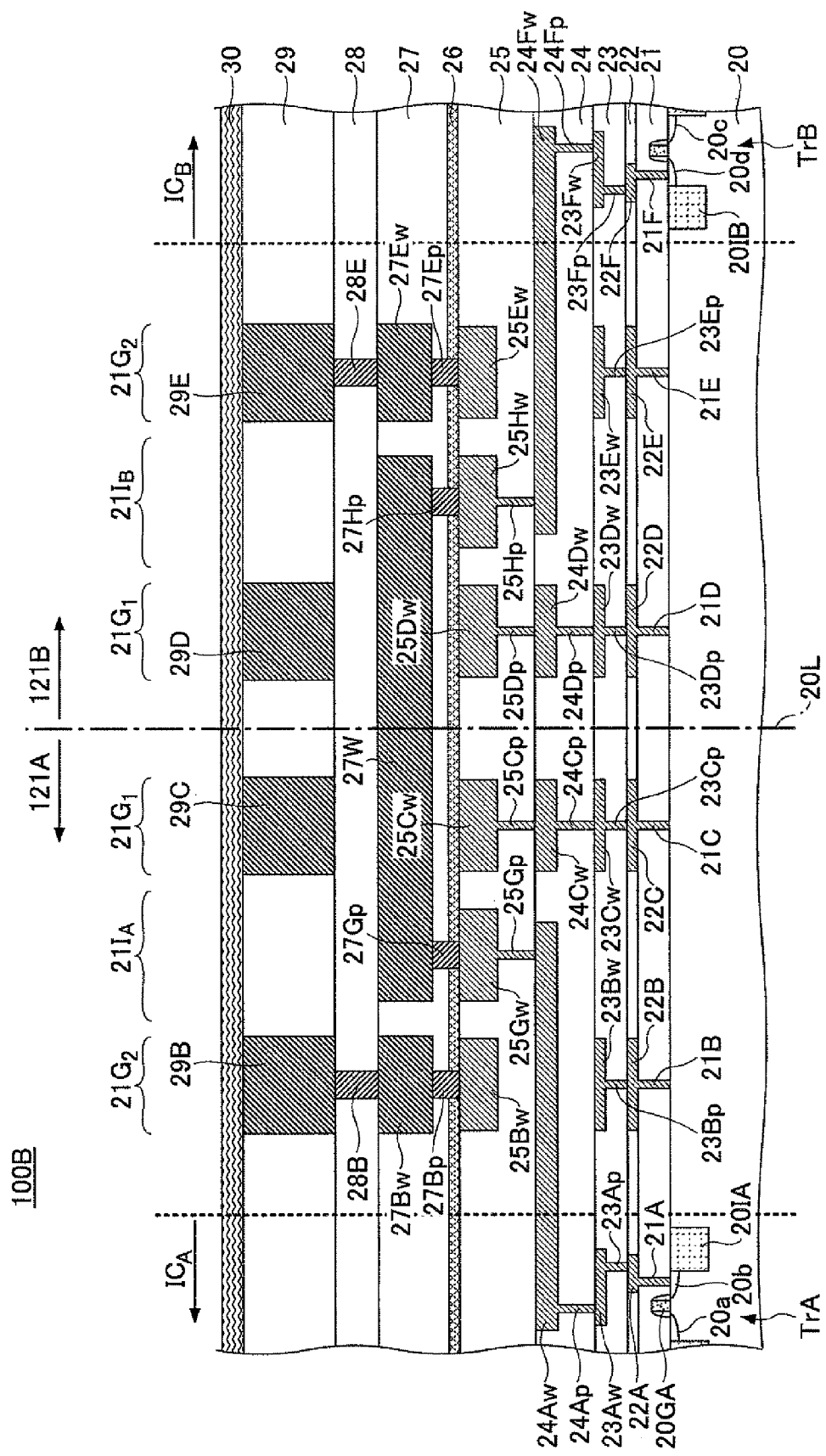
FIG. 4 is a sectional view of the semiconductor device sectioned along a line A-A' in FIG. 3.

FIG. 4 is a cross-sectional view of the semiconductor device 100B sectioned along a line A-A' in FIG. 3.

Referring to FIG. 4, the semiconductor device 100B is formed on a silicon substrate 20 corresponding to the semiconductor wafer 10. In the silicon substrate 20, the element region 121A is formed at a left side and an element region 121B is formed at a right side of the space region 20L depicted by a dashed line.

The element region 121A includes an internal circuit $IC_A$ depicted by a dotted line. An active region is defined in the internal circuit $IC_A$ by an element separation region 20IA. A transistor TrA is formed including a source region 20a and a drain region 20b, in which a gate electrode 20GA is formed in the active region. Moreover, the element region 121B includes an internal circuit $IC_B$ depicted by a dotted line. An active region is defined in the internal circuit $IC_B$ by an element separation region 20IB. A transistor TrB is formed including a source region 20c and a drain region 20d, in which a gate electrode 20GB (FIG. 9A) is formed in the active region.

The element regions 121A and 121B share, with each other, various insulation films and a multilayer interconnection structure formed by a laminate of wiring layers, which are formed on the silicon substrate 20.

Specifically, an inter-layer insulation film 21 covering the transistor TrA and TrB is subsequently formed from the element region 121A to the element region 121B on the silicon substrate 20. Other inter-layer insulation films 22, 23, 24, and 25 are sequentially formed on the inter-layer insulation film 21 in the same manner.

In the inter-layer insulation film 21, via contacts 21A, 21B, 21C, 21D, 21E, and 21F are formed. The via contacts 21A and 21F include via plugs which are made from Tungsten (W) and contact the drain region 20b of the transistor TrA and the drain region 20d of the transistor TrB, respectively. In the via contacts 21A through 21F, the via contacts 21A and 21F form the via plugs contacting the drain regions 21b and 21d, respectively.

The via contact 21C forms a wall successively surrounding the element region 121A, and forms the lowest layer of the sealing $21G_1$ of the element region 121A. Also, the via contact 21B forms another wall successively surrounding the element region 121A, and forms the lowest layer of the sealing $21G_2$ of the element region 121A. In the same manner, the via contact 21D forms a wall successively surrounding the element region 121B, and forms the lowest layer of the sealing $21G_1$ of the element region 121B. Furthermore, the via contact 21E forms another wall successively surrounding the element region 121B, and forms the lowest layer of the sealing $21G_2$ of the element region 121B.

In the inter-layer insulation film 22, conductive patterns 22A, 22B, 22C, 22D, 22E, and 22F (which may be made from Cu or the like and may be regarded as Cu patterns) contacting the via contacts 21A through 21F are formed as a first wiring layer. In the conductive patterns 22A through 22F, the conductive pattern 22A forms a wiring pattern for contacting the via contact 21A. Also, the conductive pattern 22F forms a wiring pattern for contacting the via contact 21F. On the contrary, the conductive pattern 22C extends with successively surrounding the element region 121A, and forms a part of the sealing $21G_1$ of the element region 121A with the via contact 21C forming the wall. Also, the conductive pattern 22B extends with successively surrounding the element region 121A, and forms a part of the sealing $21G_2$ of the element region 121A with the via contact 21B forming the wall.

Similarly, the conductive pattern 22D extends with successively surrounding the element region 121B, and forms a part of the sealing $21G_1$ of the element region 121B with the via contact 21D forming the wall. Also, the conductive pattern 22E extends with successively surrounding the element region 121B, and forms a part of the sealing $21G_2$ of the element region 121B with the via contact 21E forming the wall.

In the inter-layer insulation film 23, conductive patterns 23Aw through 23Fw, which may be made from Cu or the like and may be regarded as Cu patterns, are formed respectively to the conductive patterns 22A through 22F. Via plugs 23Ap and 23Fp extend downward from the conductive patterns 23Aw and 23Fw. The Cu via plugs 23Ap and 23Fp contact the conductive patterns 22A and 22F, respectively. The conductive pattern 23Aw and the conductive pattern 23Fw form portions of the multilayer interconnection in the element region 121A and the element region 121B, respectively.

On the other hand, the conductive patterns 23Bw and 23Cw as the Cu patterns extend by successively surrounding the element region 121A. A Cu via pattern 23Bp extends downward from the conductive pattern 23Bw and forms the wall of an inner side surrounding the element region 121A. The conductive pattern 23Bw and the Cu via pattern 23Bp form a part of the sealing $21G_2$ of the inner side surrounding the element region 121A with the conductive pattern 22B formed below.

The Cu via pattern 23Cp extends downward from the conductive pattern 23Cw and forms the wall of an outer side surrounding the element region 121A. The conductive patterns 23Cw and the Cu via pattern 23Cp form a part of the sealing $21G_2$ of the outer side surrounding the element region 121A with the Cu pattern 22C formed below.

The conductive patterns 23Dw and 23Ew successively extend to surround the element region 121B. A Cu via pattern 23Dp extends downward from the conductive pattern 23Dw, and forms the wall of the outer side surrounding the element region 121B. The conductive pattern 23Dw and the Cu via pattern 23Dp form a part of the sealing $21G_1$ surrounding the element regions 121B with the Cu pattern 22D formed below.

Also, a Cu via pattern 23Ep extends downward from the conductive pattern 23Ew, and forms the wall of the inner side surrounding the element region 121B. The conductive pattern 23Ew and the Cu via pattern 23Ep form a part of the sealing $21G_2$ of the inner side surrounding the element region 121B with the Cu pattern 22E below.

In the inter-layer insulation film 24, conductive patterns 24Aw, 24Bw, 24Cw, 24Dw, 24Ew, and 24Fw, which may be made from Cu or the like and may be regarded as Cu patterns, are formed respectively to the conductive patterns 23Aw, 23Bw, 23Cw, 23Dw, 23Ew, and 23Fw. The Cu via plug 23Ap and 24Fp extend from the Cu pattern 24Aw and 24Fw, respectively, and form a wall. The Cu via plugs 24Ap and 24Fp contact the conductive pattern 23Aw and 23Fw, respectively. By this configuration, the conductive patterns 24Aw and 24Fw form portions of the multilayer interconnection in the element region 121A and the element region 121B, respectively.

In this case, in the element region 121A, it may be noted that the conductive pattern 24Aw as the Cu wiring pattern extends from the internal circuit $IC_A$ above a lower portion of the sealing $21G_2$ of the inner side, to a first sealing region $21I_A$ in a region between the sealing $21G_2$ of the inner side and the sealing $21G_1$ of the outer side. In the element region 121A, the lower portion of the sealing $21G_2$ of the inner side is formed by the via contact 21B, the conductive pattern 22B, the Cu via pattern 23Bp, and the conductive pattern 23Bw.

Similarly, in the element region 121B, the conductive pattern 24Fw as the Cu wiring pattern extends from the internal circuit $IC_B$ above a lower portion of the sealing $21G_2$ of the inner side, to a second sealing region $21I_B$ in a region between the sealing $21G_2$ of the inner side and the sealing $21G_1$ of the outer side. In the element region 121B, the lower portion of the sealing $21G_2$ of the inner side is formed by the via contact 21E, the conductive pattern 22E, the Cu via pattern 23Ep, and the conductive pattern 23Ew.

On the other hand, a Cu via pattern 24Bp extends downward from the conductive pattern 24Bw and forms the wall of the inner side surrounding the element region 121A. The conductive pattern 24Bw is not illustrated in the sectional view in FIG. 4 since the conductive pattern 24Bw is out of the view in FIG. 4. The Cu conductive pattern 24Bw and the Cu via pattern 24Bp form a portion of the sealing $21G_2$ of the inner side surrounding the element region 121A with the conductive pattern 23Bw below. It may be noted that the conductive pattern 24Aw as the Cu wiring pattern is formed on a discontinuation between the Cu pattern 24Bw and the Cu via pattern 24Bp.

A Cu via pattern 24Cp extends downward from the conductive pattern 24Cw as the Cu pattern and forms the wall of the outer side surrounding the element region 121A. The conductive pattern 24Cw and the Cu via pattern 24Cp form a portion of the sealing $21G_1$ of the outer side with the conductive pattern 23Cw below.

Similarly, a Cu via pattern 24Dp extends downward from the conductive pattern 24Dw as the Cu pattern and forms the wall of the outer side surrounding the element region 121B. The Cu via pattern 24Dp forms a portion of the sealing $21G_1$ of the outer side surrounding the element region 121B with the conductive pattern 23Dw below.

Furthermore, a Cu via pattern 24Ep extends downward from a conductive pattern 24Ew as the Cu pattern and forms the wall of the inner side surrounding the element region 121B. The conductive pattern 24Ew is not illustrated in the sectional view in FIG. 4 since the conductive pattern 24Ew is out of the view in FIG. 4. Also, the Cu via pattern 24Ep is out of the view in FIG. 4. The Cu pattern 24Ew and the Cu via pattern 24Ep form a portion of the sealing $21G_2$ of the inner side surrounding the element region 121B with the conductive pattern 23Ew below. It may be noted that the conductive pattern 24Fw as the Cu wiring pattern is formed on a discontinuation between the Cu pattern 24Ew and the Cu via pattern 24Ep.

In the inter-layer insulation film 25, conductive patterns 25Bw, 25Cw, 25Dw, 25Ew, and 25Fw may be made by Cu or the like, and are formed by corresponding to the conductive patterns 24Bw, 24Cw, 24Dw, 24Ew, and 24Fw in the inter-layer insulation film 24. Moreover, a Cu pattern 25Gw is formed in the first sealing region $21I_A$ and a Cu pattern 25Hw is formed in the second sealing region $21I_B$.

Via plugs 25Gp and 25Hp extend downward from the Cu patterns 25Gw and 25Hw, and contact the conductive patterns 24Aw and 24Fw regarded as the Cu wiring patterns. By this configuration, the Cu patterns 25Gw and 25Hw form portions of the multiplayer wiring in the element regions 121A and 121B, respectively.

On the other hand, the conductive pattern 25Bw successively extends to surround the element region 121A, and a Cu contact 25Bp extends downward from the conductive pattern 25Bw regarded as the Cu pattern, thereby the wall of the inner side surrounding the element region 121A is formed. The conductive pattern 25Bw and the Cu contact 25Bp form portions of the sealing $21G_2$ surrounding the element region 121A with the conductive pattern 24Bw below.

Also, the conductive pattern 25Cw as the Cu pattern successively extends to surround the element region 121A, and the Cu via pattern 24Cp extends downward from the conductive pattern 25Cw, thereby the wall of the outer side surrounding the element region 121A is formed. The conductive pattern 25Cw and a Cu contact 25Cp form portions of the sealing $21G_2$ of the outer side surrounding the element region 121A with the conductive pattern 25Cw below. It may be noted that since the Cu contact 25Bp is discontinued at a place where the conductive pattern 24Aw is formed, the Cu contact pattern 25Bp is not illustrated in the sectional view in FIG. 4.

Also, similarly, a Cu contact 25Dp extends downward from the conductive pattern 25Dw which may be formed to be a Cu pattern, and forms the wall of the outer side surrounding the element region 121B. The conductive pattern 25Dw and the Cu contact 25Dp form portions of the sealing $21G_1$ surrounding the element 121B with the Cu pattern 24Dw below.

A Cu contact 25Ep extends downward from the conductive pattern 25Ew, and forms the wall of the inner side surrounding the element region 121B. The conductive pattern 25Ew and the Cu contact 25Ep form portions of the sealing $21G_2$ surrounding the element region 121B with the Cu pattern 24Ew below. It may be noted that since the Cu contact 25Ep is discontinued at a place where the conductive pattern 24Fw is formed, the Cu contact 25Ep is not illustrated in the sectional view in FIG. 4.

In the first embodiment, on the inter-layer insulation film 25 formed as described above, an insulative moisture resistant film 26 may be formed with an $Al_2O_3$ film having a film thickness of 5 to 20 nm. The $Al_2O_3$ film may be easily formed by a sputtering method or a Metal Organic Chemical Vapor Deposition (MOCVD) method. The moisture resistant film is not limited to the $Al_2O_3$ film, and an SiN film may be used as the moisture resistant film 26. The moisture resistant film 26 is a film which deters liquid ($H_2O$) or hydrogen ($H_2$) such as water from being permeated.

An inter-layer insulation film 27 is formed on the moisure resistant film 26, and an Al (Alminum) pattern 27Bw is formed by corresponding to the conductive pattern 25Bw in the inter-layer insulation film 27. The Al pattern 27Bw successively extends to surround the element region 121A. An Al contact 27Bp extends downward from the Al pattern 27Bw, and the Al contact 27Bp forms the wall of the inner side surrounding the element region 121A by corresponding to the Al pattern 27Bw. The Al contact 27Bp contacts the Al pattern 27Bw. By this configuration, the Al pattern 27Bw and the AL contact 27Bp form portions of the sealing $21G_2$ of the inner side with a configuration of the conductive pattern 25Bw as the Cu pattern, and the like.

In the inter-layer insulation film 27, the Al (Aluminum) pattern 27Cw corresponding to the conductive pattern 25Cw is formed, and the Al pattern 27Cw successively extends to surround the element region 121A, excluding a sectional surface in FIG. 4. Accordingly, the Al pattern 27Cw is not depicted in the sectional surface illustrated in FIG. 4. An Al contact 27Cp extends downward from the Al pattern 27Cw, and forms the wall of the outer side surrounding the element region 121A by corresponding to the Al pattern 27Cw. The Al contact 27Cp is not illustrated in FIG. 4, and is formed outside the sectional view illustrated in FIG. 4. The Al contact 27Cp contacts the Al pattern 27Cw. The Al pattern 27Cw and the Al contact 27Cp form portions of the sealing $21G_1$ with configurations of the Cu pattern 25Cw and the like below.

Also, in the inter-layer insulation film 27, an Al pattern 27Dw corresponding to the conductive pattern 25Dw is formed, and the Al pattern 27Dw successively extends to surround the element region 121B, except for the sectional surface illustrated in FIG. 4. Thus, the Al pattern 27Dw is not illustrated in the sectional view of FIG. 4. The Al contact 27Dp extends downward from the Al pattern 27Dw, and corresponds to the Al pattern 27Dw, thereby the wall of the outer side surrounding the element region 121B is formed. The Al contact 27Dp is also discontinued in the sectional surface in FIG. 4, and is not illustrated in FIG. 4. The Al contact 27Dp contacts the Al pattern 27Dw. The Al pattern 27Dw and the Al contact 27Dp form portions of the sealing $21G_1$ with configurations of the conductive pattern 25Dw and the like below.

In the inter-layer insulation film 27, the Al pattern 27Ew corresponding to the Cu pattern 25Ew is further formed. The Al pattern 27Ew successively extends to surround the element region 121B. An Al contact 27Ep extends downward from the Al pattern 27Ew and forms the wall of the inner side surrounding the element region 121B. The Al contact 27Ep contacts the Cu pattern 27Ew. Thus, the Al pattern 27Ew and the Al contact 27Ep form portions of the sealing $21G_2$ of the inner side with configuration of the Cu pattern 25Ew and the like below.

It may be noted that in the inter-layer insulation film 27, an Al wiring pattern 27W is formed by extending from the first sealing region $21I_A$ to the second sealing region $21I_B$, that is, from the element region 121A to the element region 121B. The Al wiring pattern 27W electrically connects a Cu wiring pattern 25Gw which partially forms the multilayer interconnection in the element region 121A, by an Al via plug 27Gp penetrating the moisture resistant film 26 above and below. Also, the Al wiring pattern 27W electrically contacts a Cu wiring pattern 25Hw which partially forms the multilayer interconnection in the element region 121B, by an Al via plug 27Hp penetrating the moisture resistant film 26 above and below. In this formation, a discontinuation is formed between the Al pattern 27Cw and the via contact 27Gp in the sectional surface illustrated in FIG. 4. Also, a discontinuation is formed between the Al pattern 27Dw and the via contact 27Dp in the sectional surface illustrated in FIG. 4. Without problems, the Al wiring pattern 27W passes the first sealing $21G_1$ from the first sealing region $21I_A$ in the element region 121A, and arrives at the second sealing $21I_B$ by further passing the first sealing $21G_1$ in the element region 121B. By the Al wiring pattern 27W formed as described above, wiring portions 21X and 21Y are formed as illustrated in FIG. 1B and FIG. 3.

In the inter-layer insulation film 27, an Al pattern 28B corresponding to the Al pattern 27Bw is formed, the Al pattern 28B successively extends on the Al pattern 27Bw on the element region 121A. Accordingly, the Al pattern 28C forms a portion of the sealing $21G_2$ of the inner side in the element region 121A. Also, in the inter-layer insulation film 28, an Al pattern 28C corresponding to the Al pattern 27Cw is formed. The Al pattern 28C successively extends to surround the element region 121A on the Al pattern 27C, except for the sectional surface in FIG. 4. Therefore, the Al pattern 28C is not depicted in the sectional view in FIG. 4, as well as the Al pattern 27C. As a result, the Al pattern 28C forms a portion of the sealing $21G_1$ in the element region 121A.

Also, in the inter-layer insulation film 28, an Al pattern 28D corresponding to the Al pattern 27Dw is formed, and successively extends to surrounding the element region 121B on the Al pattern 27Dw, except for the sectional surface illustrated in FIG. 4. Thus, the Al pattern 28D is not depicted in the sectional view in FIG. 4, as well as the Al pattern 27Dw. As a result, the Al pattern 28D forms a portion of the sealing $21G_1$ of the outer side in the element region 121B. Furthermore, an Al pattern 28E corresponding to the Al pattern 27Ew is formed in the inter-layer insulation film 28, and successively extends on the Al pattern 27Ew to surround the element region 121B. The Al pattern 28E forms a portion of the sealing $21G_2$ of the inner side in the element region 121B.

In the inter-layer insulation film 28, an Al pattern 29B corresponding to the Al pattern 28B is formed, and successively extends on the Al pattern 28B to surround the element region 121A. The Al pattern 29B forms a top portion of the sealing $21G_2$ of the inner side in the element region 121A. Similarly, an Al pattern 29C corresponding to the Al pattern 28C in the inter-layer insulation film 29 is formed, and successively extends on the Al pattern 28C to surround the element region 121A. The Al pattern 29C forms a top portion of the sealing $21G_1$ in the element region 121A.

Also, in the inter-layer insulation film 29, an Al pattern 29D corresponding to the Al pattern 28D is formed, and successively extends on the Al pattern 28D to surround the element region 121B. The Al pattern 29D forms a portion of the sealing 21G₁ in the element region 121B. Furthermore, an Al pattern 29E corresponding to the Al pattern 28E is formed in the inter-layer insulation film 28 is formed, and successively extends on the Al pattern 28E to surround the element region 121B. The Al pattern 29E forms a portion of the sealing 21G₂ of the inner side in the element region 121B.

Furthermore, on the inter-layer insulation film 29, a protection film 30, which may be made from polyimide, is formed to cover the Al patterns 29B through 29E.

Figure 5:
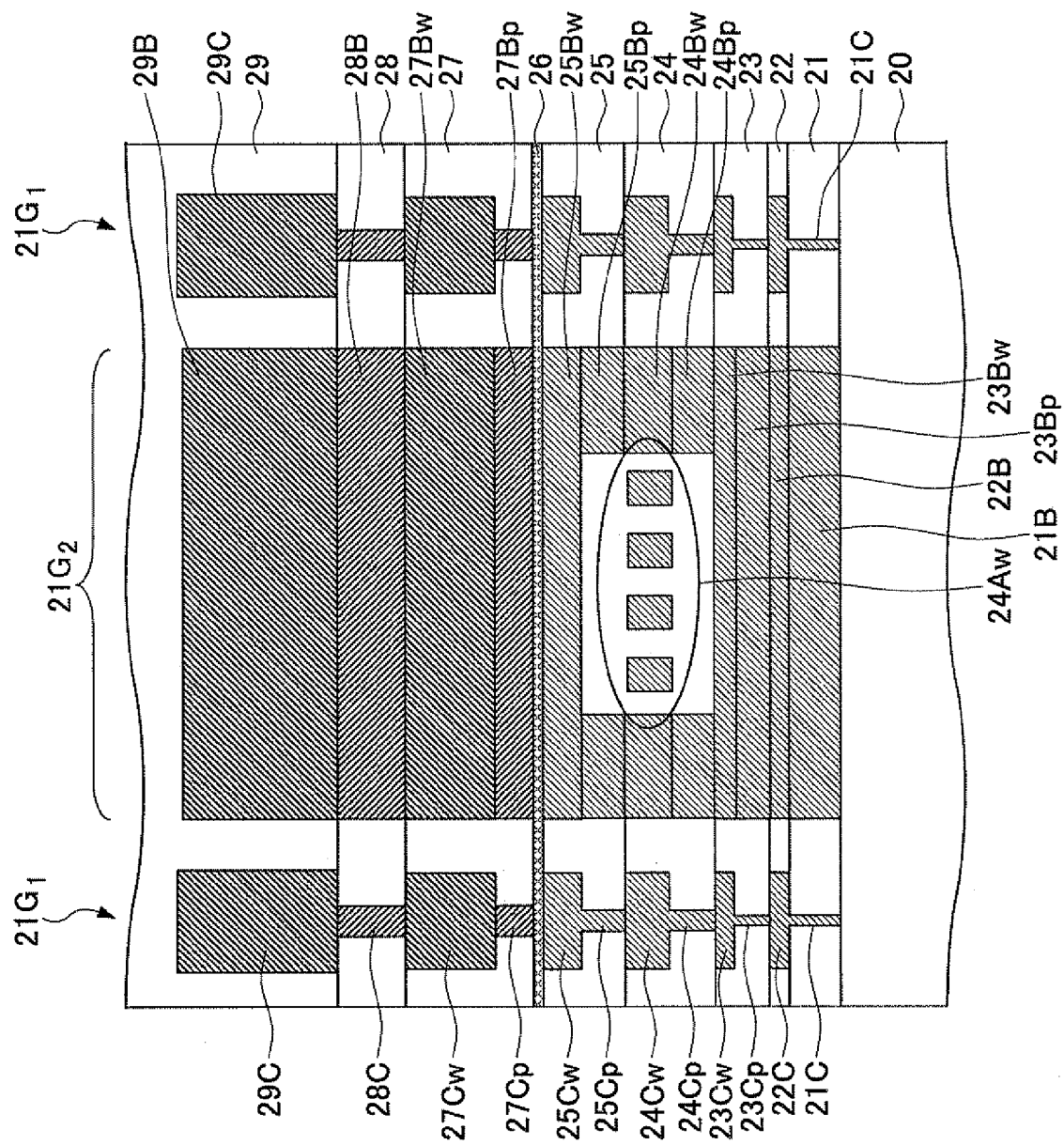
FIG. 5 is a sectional view of the semiconductor device sectioned along a line B-B' in FIG. 3.

FIG. 5 is a sectional view of the element region 121A sectioned along a line A-A' in the semiconductor device 100B in FIG. 3.

Referring to FIG. 5, the sectional view depicts an elevation view of the sealing 21G₂ of the inner side for the internal circuit IC_A. The sealing 21G₂ of the outer side is formed by a layer stack of the via contact 21B, the conductive pattern 22B, the Cu via pattern 23Bp, the conductive pattern 23Bw, the Cu via pattern 24Bp, the conductive pattern 24Bw, the Cu contact 25Bp, the conductive pattern 25Bw, the Al pattern 27Bp, the Al pattern 27Bw, the Al pattern 28B, and the Al pattern 29B. In addition, a discontinuation is formed on the Cu via pattern 24Bp, the conductive pattern 24Bw, and the Cu contact 25Bp, for the conductive pattern 24Aw as the wiring pattern to pass. This discontinuation is filled up with the inter-layer insulation films 24 and 25.

Moreover, a portion of the sealing 21G₁ of the outer side is seen at both sides of the sealing 21G₂ of the inner side on the sectional view illustrated in FIG. 5.

Figure 6:
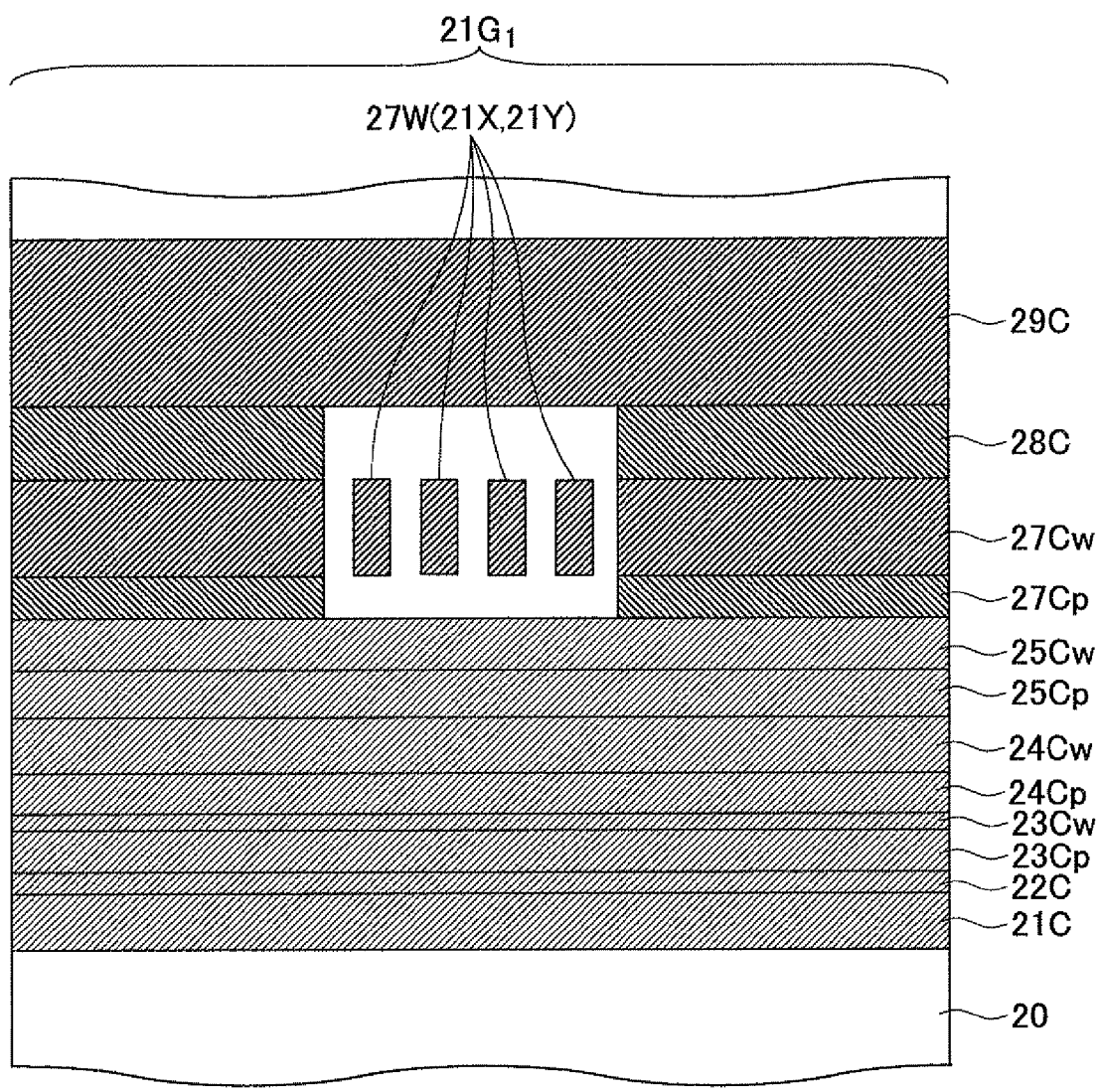
FIG. 6 is a sectional view of the semiconductor device sectioned along a line D-D' in FIG. 3.

FIG. 6 is a sectional view illustrating a sectional surface of the element region 121 sectioned along a line C-C' in the semiconductor device 100B in FIG. 3.

Referring to FIG. 6, the sectional view illustrates an elevation view of the sealing 21G₁ of the outer side for the internal circuit IC_A. The sealing 21G₁ of the outer side is formed by the layer stack of the via contact 21C, the Cu pattern 22C, the conductive pattern 23Cp as the Cu pattern, the conductive pattern 23Cw as the Cu pattern, the Cu via pattern 24Cp, the Cu pattern 24Cw, the Cu contact 25Cp, the Cu pattern 25Cw, the Al pattern 27Cp, the Al pattern 27Cw, the Al pattern 28C, and the Al pattern 29C. Moreover, a discontinuation is formed on the Al patterns 27Cp, 27Cw, and 28C, for the Al wiring pattern 27W to pass. This discontinuation is filled up with the inter-layer insulation films 27 and 28. The Al wiring pattern 27W forms the wiring portions 21X and 21Y.

Figure 7:
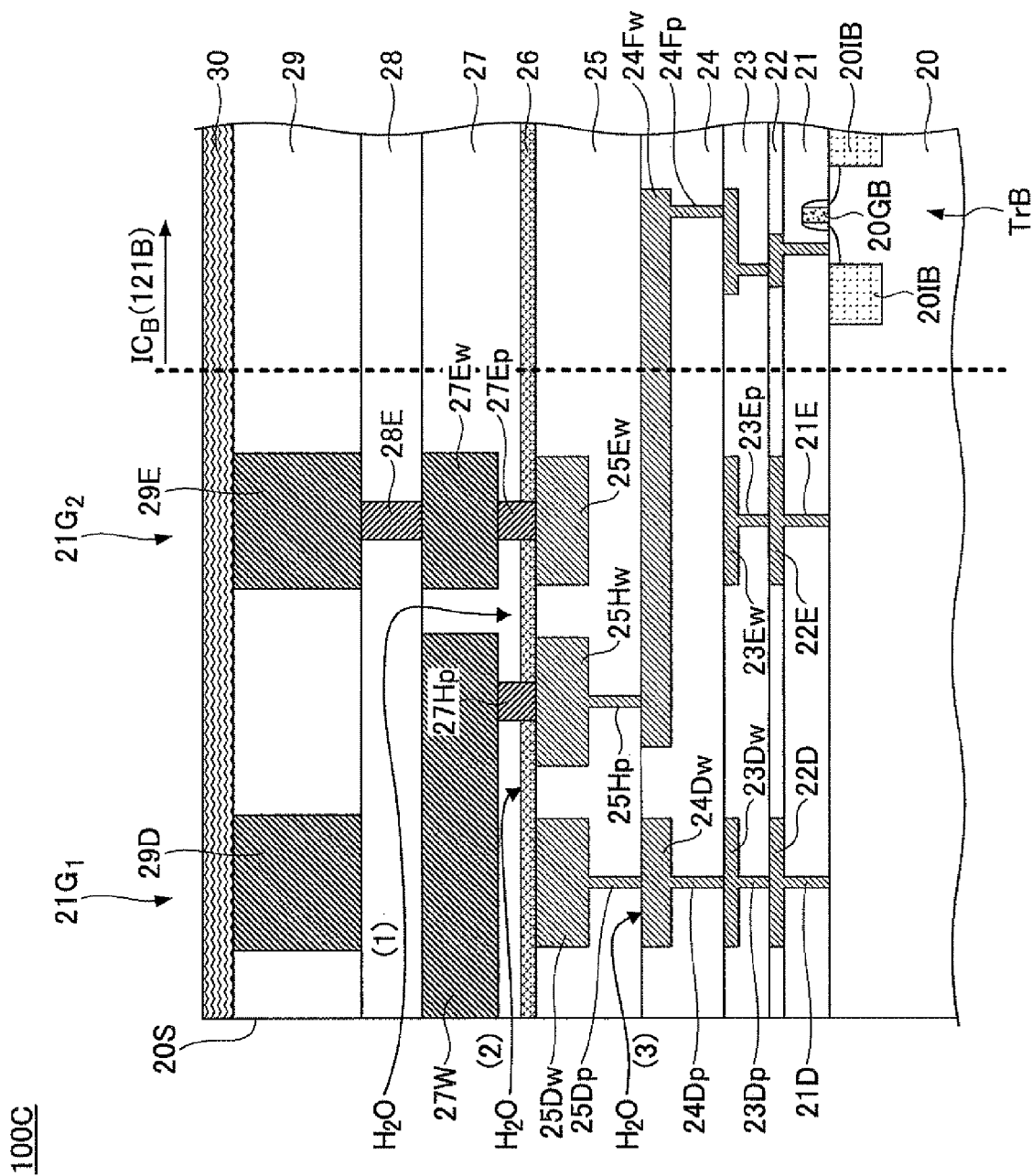
FIG. 7 is a sectional view of the single core semiconductor device acquired by cutting the multi-core semiconductor device in FIG. 3.

FIG. 7 is a sectional view of a part of the sectional surface previously illustrated in FIG. 4, related to a semiconductor device 100C having a single core configuration as illustrated in FIG. 1B, which is acquired by cutting the semiconductor device 100B of the dual core configuration in FIG. 3 along the space region 20L in FIG. 1A corresponding to the scribe line 10L in FIG. 2.

Referring to FIG. 7, in the first embodiment, as a result from cutting the silicon substrate 20 and the layer stack configuration of the inter-layer insulation films and the wiring layers formed on the silicon substrate 20, a side wall surface 20S respective to the space region 20L is formed as a cut surface, the side wall surface 20S demarcates the semiconductor device 100C. Also, the Al wiring pattern 27W is exposed on the side wall surface.

In this configuration in which the Al wiring pattern 27W is exposed in the side wall surface 20S, it may be predicted that moisture H₂O enters the semiconductor 100C along an interface between a metal such as Al forming the Al wiring pattern 27W and the inter-layer insulation film 28 or 27. However, the moisture, which enters along the interface between the Al pattern 27W and the inter-layer insulation film 28, or along the inter-layer insulation films 28 and 29, is blocked by the moisture resistant film 26 and the sealing 21G₂ as indicated as a path (1) in FIG. 7. Thus, it is possible to prevent the moisture H₂O of the path (1) from entering the internal circuit IC_B.

Moreover, moisture H₂O, which enters along the interface between the Al wiring pattern 27W and the inter-layer insulation film 27, is blocked by actions of the moisture resistant film 26 and the sealing 21G₂ as indicated by a path (2) in FIG. 7. Thus, it is possible to prevent the moisture H₂O of the path (2) from arriving at the internal circuit IC_B.

Furthermore, moisture H₂O, which enters along any of the inter-layer insulation films 22 through 25, is blocked at the sealing 21G₁ of the outer side, as indicated by a path (3) in FIG. 7. Thus, it is possible to prevent the moisture H₂O from entering the internal circuit IC_B.

As described above, in the semiconductor device 100B of the multi-core configuration illustrated in FIG. 3, even in a case of applying a sectional surface configuration including the moisture resistant film 26 illustrated in FIG. 4 and forming the semiconductor device 100C of the single core configuration as illustrated in FIG. 1B by cutting the semiconductor device 100B along the space region 20L or 20M corresponding to the scribe line 10L or 10M, it is possible to prevent the moisture H₂O from entering the internal circuit IC_B due to actions by the sealing 21G₁, the sealing 21G₂, and the moisture resistant film 26, in which the sealing 21G₁ and the sealing 21G₂ form a double sealing. A similar effect may be obtained in a case of forming the semiconductor device 100B of the dual core configuration illustrated in FIG. 3 by cutting the semiconductor device 100A of the multi-core configuration in FIG. 1A, or the like.

It may be noted that the sectional surface illustrated in FIG. 7 is also formed at a portion where the wiring portion 21Y is formed. That is, the sectional surface in FIG. 7 is not limited to the semiconductor of the single core configuration but may be formed in the semiconductor device of the multi-core configuration.

Figure 8:
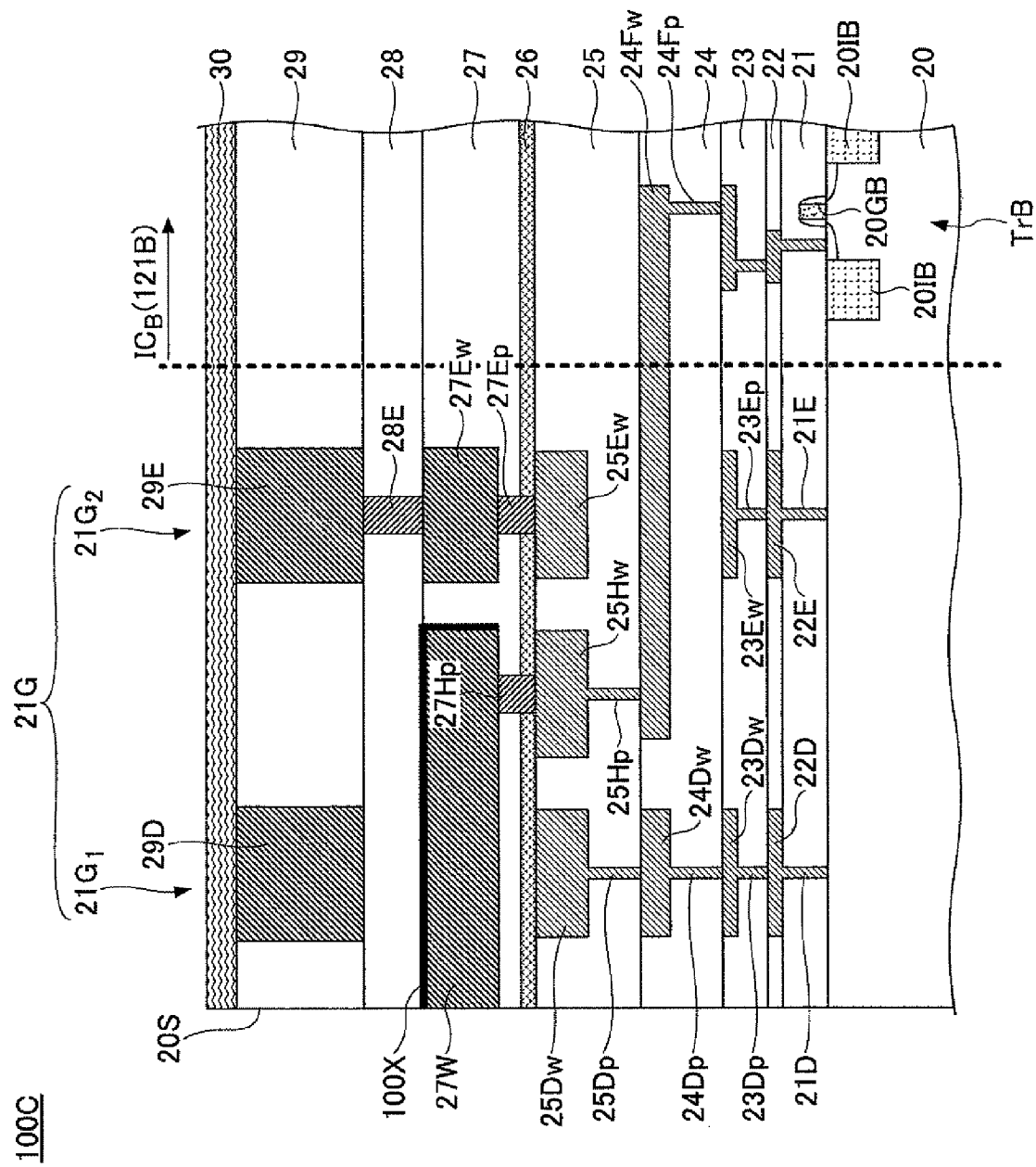
FIG. 8 is a diagram for explaining crack propagation in the sectional view illustrated in FIG. 7 in the first embodiment.

FIG. 8 is a sectional view briefly illustrating an aspect in which a crack enters the semiconductor device 100C at the same sectional surface in FIG. 7, in a case of cutting along the space region 20L or 20M.

Referring to FIG. 8, it may be considered that a crack 100X depicted by a thick line easily propagates along the interface between the Al wiring pattern 27W made from the metal and the insulation film 28 or 27. However, the Al wiring pattern 27W does not successively extend until the internal circuit IC_B, and is discontinued in a sealing region between the sealing 21G₁ of the outer side and the sealing 21G₂ of the inner side. Accordingly, it is possible to prevent the crack 100X from propagating to the internal circuit IC_B.

As described above, in the semiconductor device 100B of the dual core configuration illustrated in FIG. 3, in a case of applying a sectional surface configuration including the moisture resistant film 26 illustrated in FIG. 4 and forming the semiconductor device 100C of the single core configuration as illustrated in FIG. 1B by cutting the semiconductor device 100B along the space region 20L or 20M corresponding to the scribe line 10L or 10M, it is possible to prevent the crack from entering the internal circuit IC_B due to actions by the sealing 21G₁, the sealing 21G₂, and the moisture resistant film 26, in which the sealing 21G₁ and the sealing 21G₂ form the double sealing. A similar effect may be obtained in the case of forming the semiconductor device 100C of the dual core configuration illustrated in FIG. 3 by cutting the semiconductor device 100A of the multi-core configuration in FIG. 1A, or the like.

Next, fabrication steps of the semiconductor device 100B of the dual core configuration in FIG. 3 having the sectional surface illustrated in FIG. 4 will be described with reference to sectional views depicted in FIG. 9A through FIG. 9L. Similar fabrication steps may be applied to the semiconductor device 100A of the multi-core configuration depicted in FIG. 1A and the semiconductor device 100C of the single core configuration depicted in FIG. 1B. In FIG. 9A through FIG. 9L described below, a right side alone, which the element region 121B is formed, in the sectional surface configuration illustrated in FIG. 4, is depicted. The left side is the same as illustrated in FIG. 4 and the explanation thereof will be omitted.

Figure 9A:
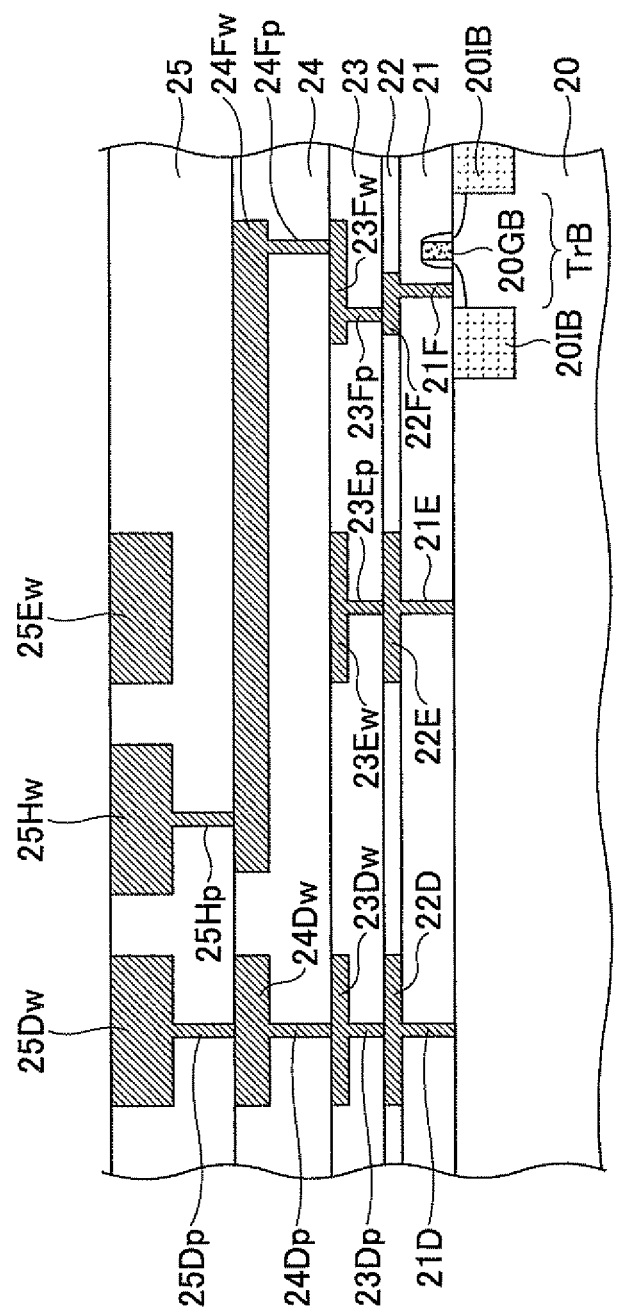
FIG. 9A is a sectional view for explaining fabrication steps of the semiconductor device in FIG. 3 and FIG. 4 (part 1)

Referring to FIG. 9A, the transistor TrB having the gate electrode 20GB is formed on the element separation region 20IB on the silicon substrate 20, the inter-layer insulation films 21 through 25 are sequentially formed with respective Cu pattern and the Cu contact. As the inter-layer insulation films 21 through 25, a silicon oxide film, which is formed by a plasma chemical vapor deposition (CVD) method using tetraethyl orthosilicate (TEOS) as raw material, may be used. Alternatively, an other film, so-called "low-dielectric constant film", may be used.

Figure 9B:
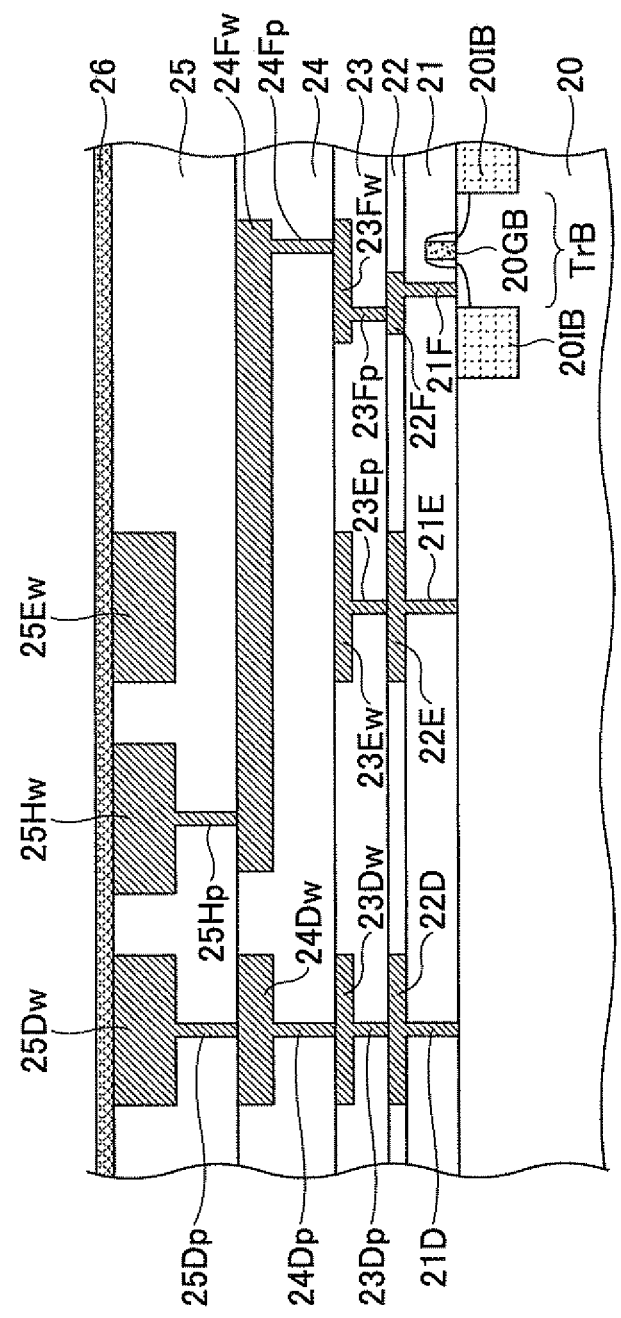
FIG. 9B is a sectional view for explaining fabrication steps of the semiconductor device in FIG. 3 and FIG. 4 (part 2)

Next, in a step in FIG. 9B, the insulative moisture resistant film 26 made from $Al_2O_3$ may be formed with a film thickness of 5 nm through 20 nm as illustrated in FIG. 9A.

Figure 9C:
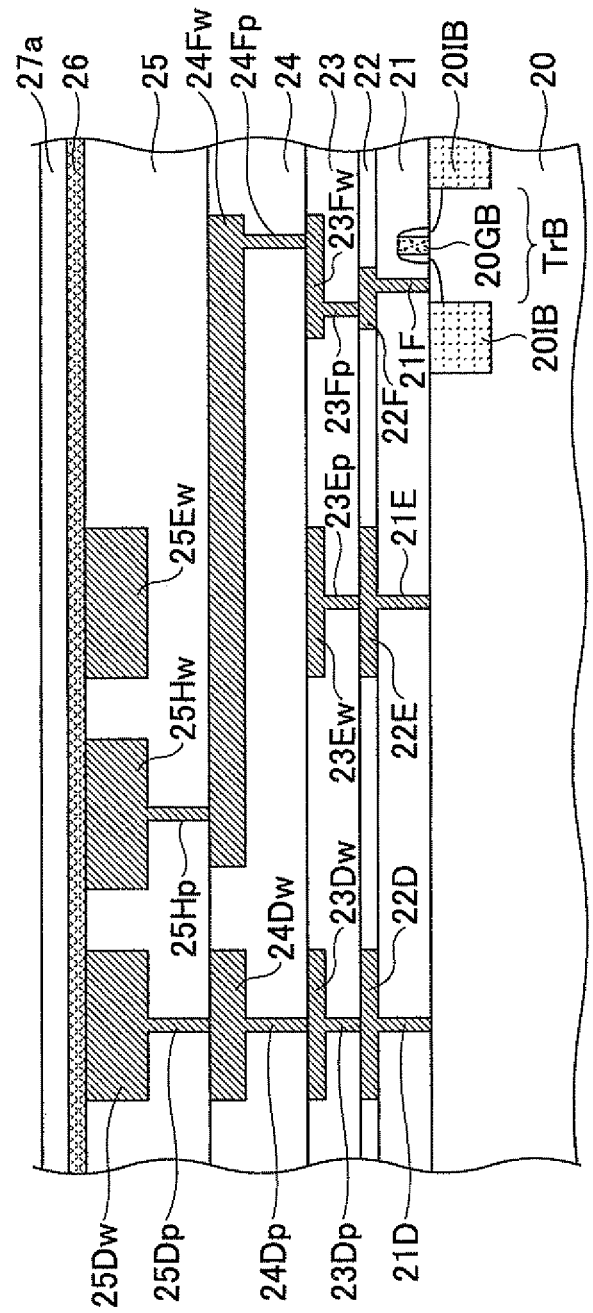
FIG. 9C is a sectional view for explaining fabrication steps of the semiconductor device in FIG. 3 and FIG. 4 (part 3)

Furthermore, as an inter-layer insulation film 27a being formed next on the insulative moisture resistant film 26 in a step in FIG. 9C, the silicon oxide film may be formed with a film thickness of 150 nm by the plasma CVD method using TEOS as raw material. Compared with the configuration in FIG. 4, the inter-layer insulation film 27a forms a bottom portion of the inter-insulation film 27.

Figure 9D:
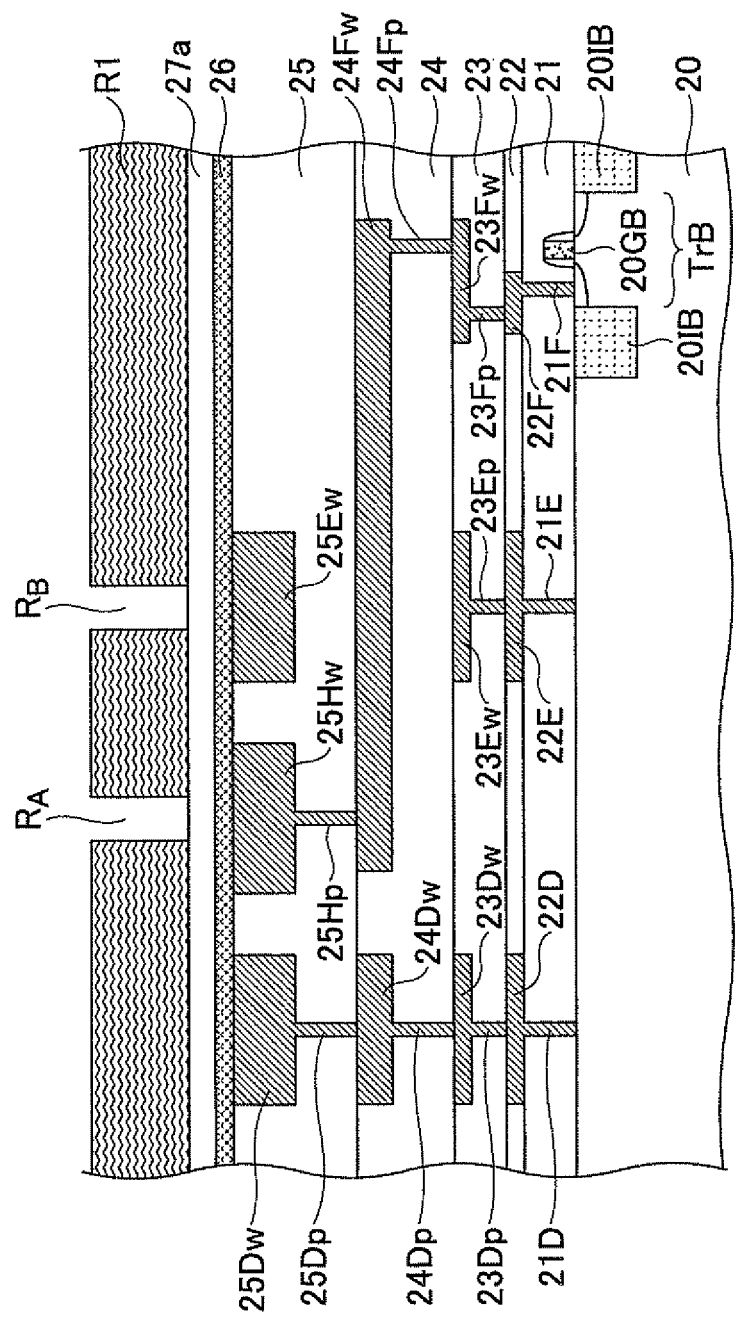
FIG. 9D is a sectional view for explaining fabrication steps of the semiconductor device in FIG. 3 and FIG. 4 (part 4)

Next, a resist film R1 is formed on the inter-layer insulation film 27a in a step in FIG. 9D, and opening parts RA and RB, in which the Cu pattern 25Hw and the conductive pattern 25Ew are exposed, are formed by patterning the resist film R1. In the inter-layer insulation film 27a, an opening part is formed for the Al contact 27Dp of the sealing $21G_1$ of the outer side. The opening is not illustrated in the sectional view in FIG. 9E.

Figure 9E:
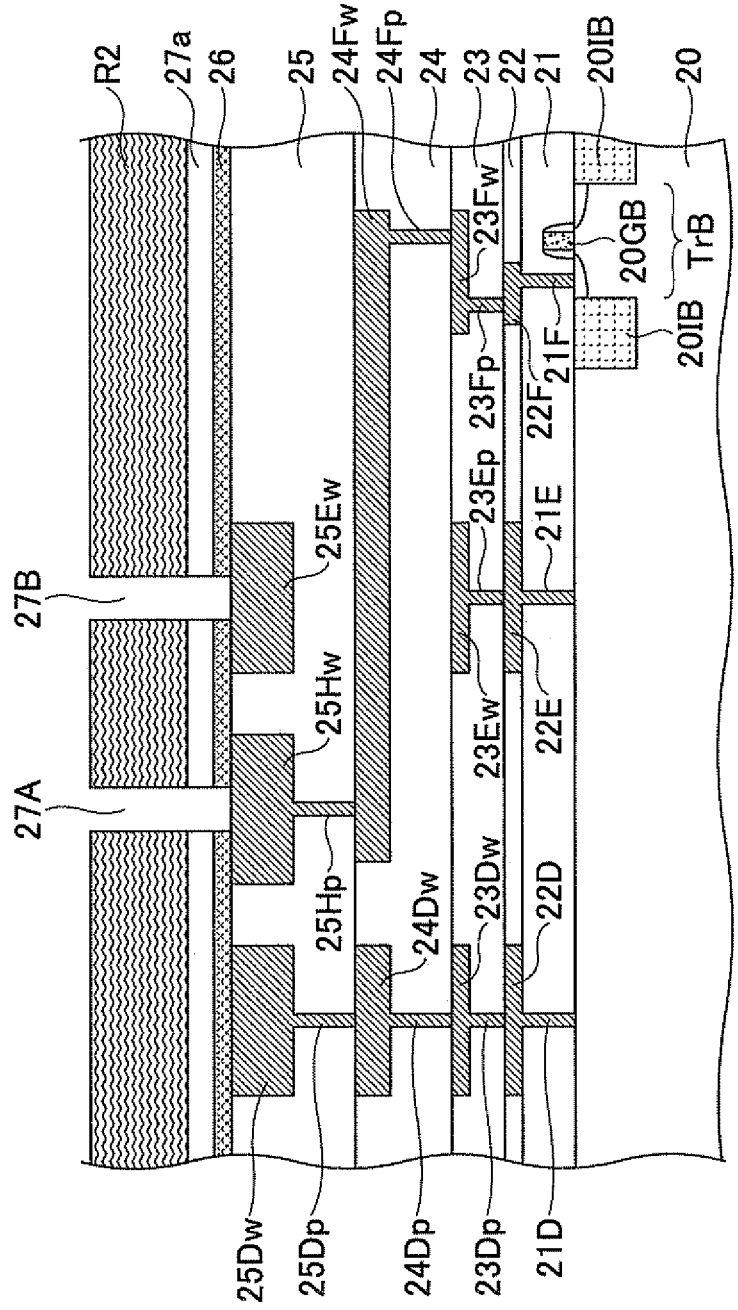
FIG. 9E is a sectional view for explaining fabrication steps of the semiconductor device in FIG. 3 and FIG. 4 (part 5)

Next, in a step in FIG. 9E, the inter-layer insulation film 27a and a hydrogen barrier film 26 below the inter-layer insulation film 27a are patterned by using the resist film R1 as a mask, via holes 27A and 27B for exposing the Cu pattern 25Hw and the conductive pattern 25Ew are formed in the inter-layer insulation film 27. A via hole, which is not illustrated in the sectional view in FIG. 9E, is formed for the Al pattern 27Dp of the sealing $21G_1$ of the outer side in the inter-layer insulation film 27a, simultaneously when the via holes 27A and 27B are formed.

Figure 9F:
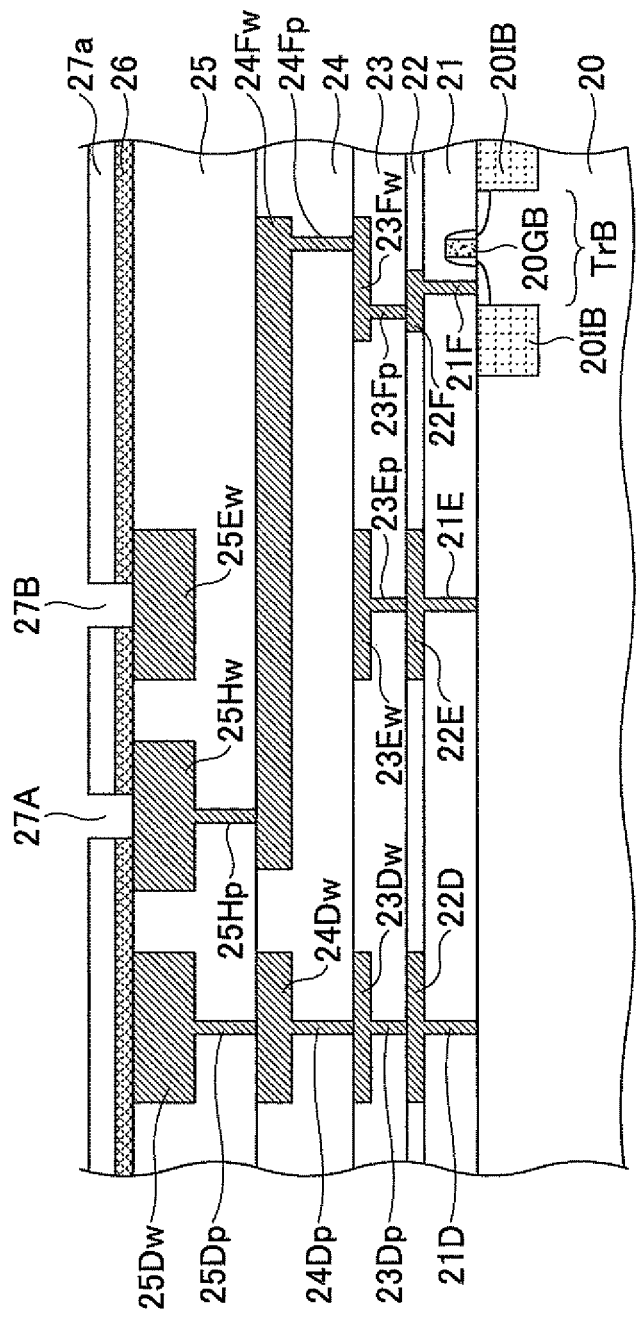
FIG. 9F is a sectional view for explaining fabrication steps of the semiconductor device in FIG. 3 and FIG. 4 (part 6)
Figure 9G:
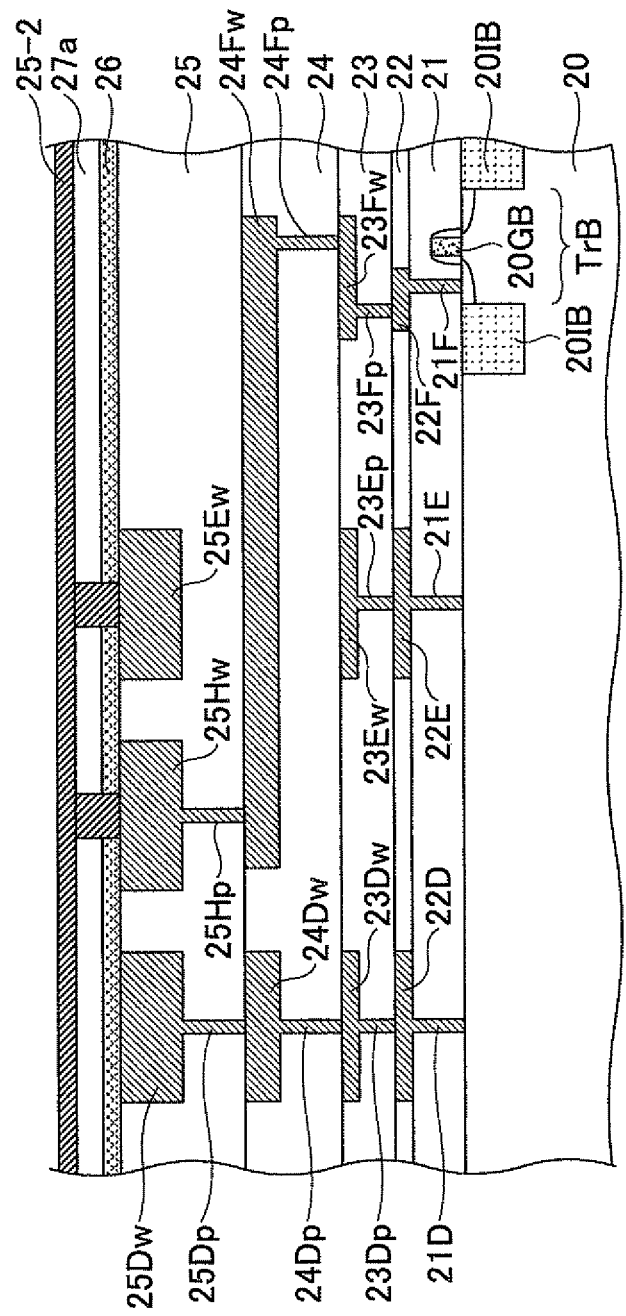
FIG. 9G is a sectional view for explaining fabrication steps of the semiconductor device in FIG. 3 and FIG. 4 (part 7)
Figure 9H:
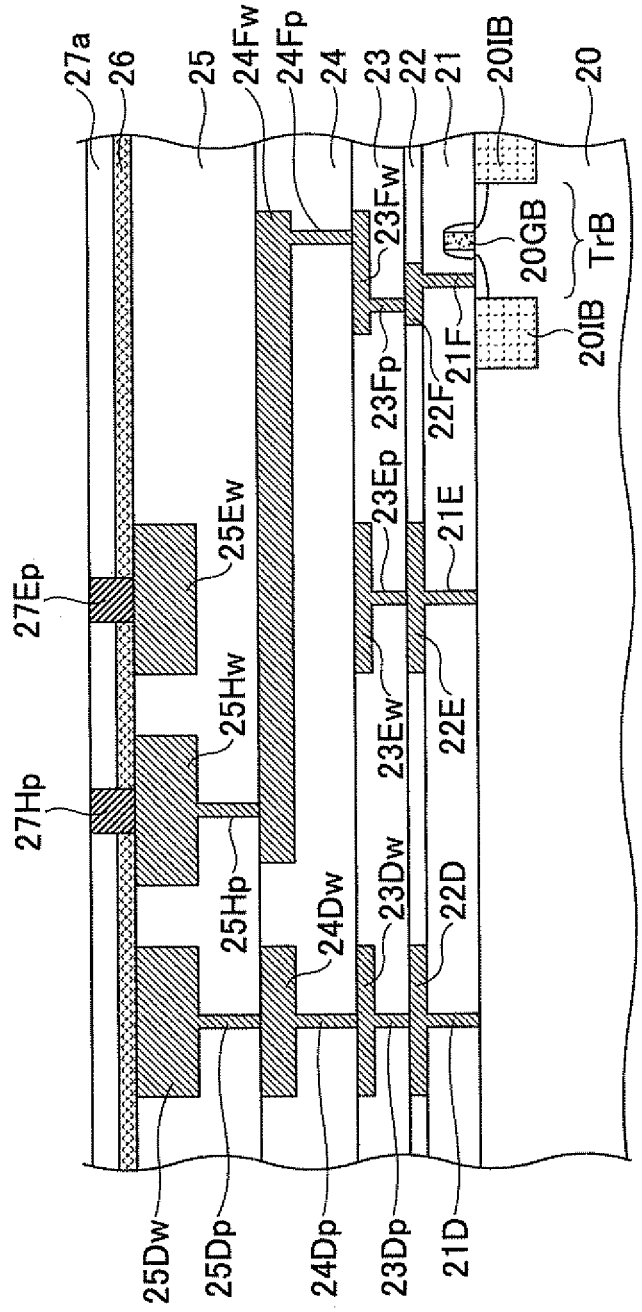
FIG. 9H is a sectional view for explaining fabrication steps of the semiconductor device in FIG. 3 and FIG. 4 (part 8)

Furthermore, after a resist film R2 is eliminated in a step in FIG. 9F, in a step in FIG. 9G, an Al film 25-2 is deposited on a configuration in FIG. 9F, and the via holes 27A and 27B are filled up. Moreover, in a step in FIG. 9H, the inter-layer insulation film 25-2, which is an excess Al film, is eliminated from a surface of the inter-layer insulation film 27a by a chemical mechanical polishing, and an Al via plug 27Hp and the Al contact 27Ep are respectively formed in the via holes 27A and 27B. Simultaneously, in a step in FIG. 9F, the Al contact 27Cp, which is a part of the sealing $21G_1$, fills up a respective via hole and is formed. The Al contact 27Cp is not depicted in FIG. 9F.

Figure 9I:
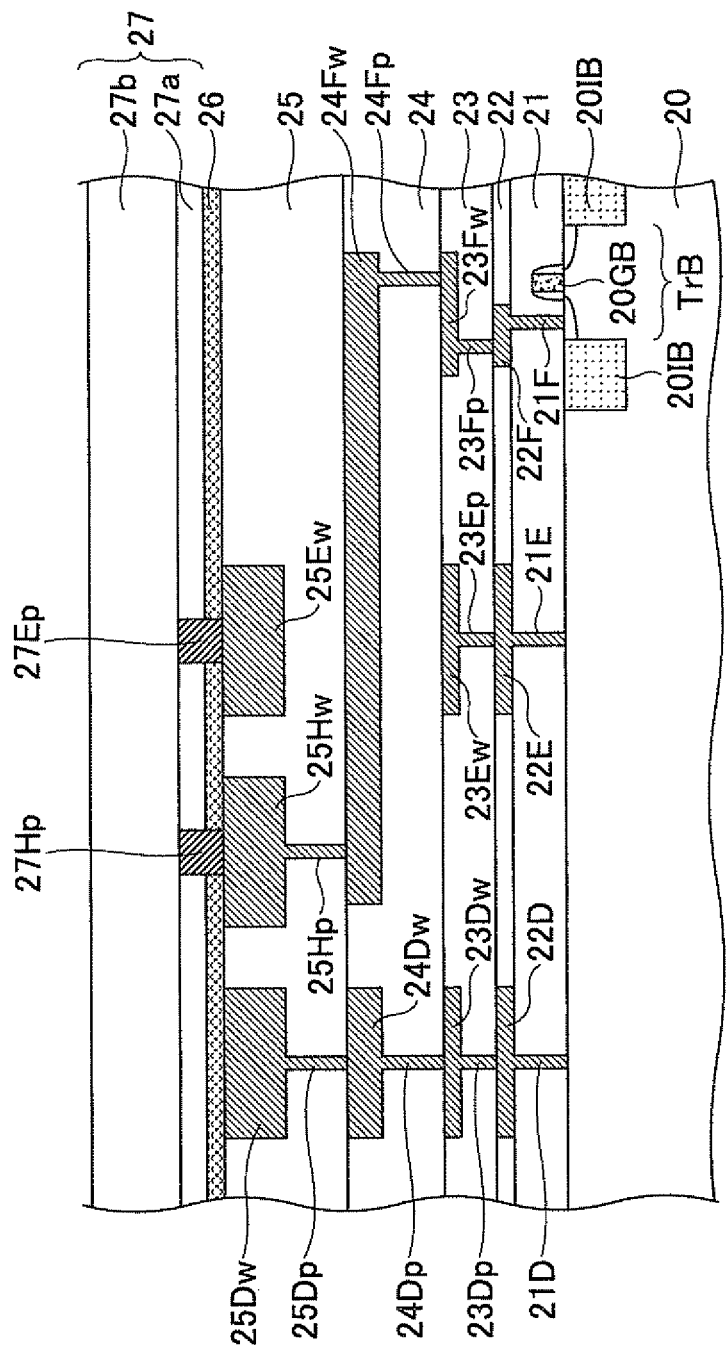
FIG. 9I is a sectional view for explaining fabrication steps of the semiconductor device in FIG. 3 and FIG. 4 (part 9)
Figure 9J:
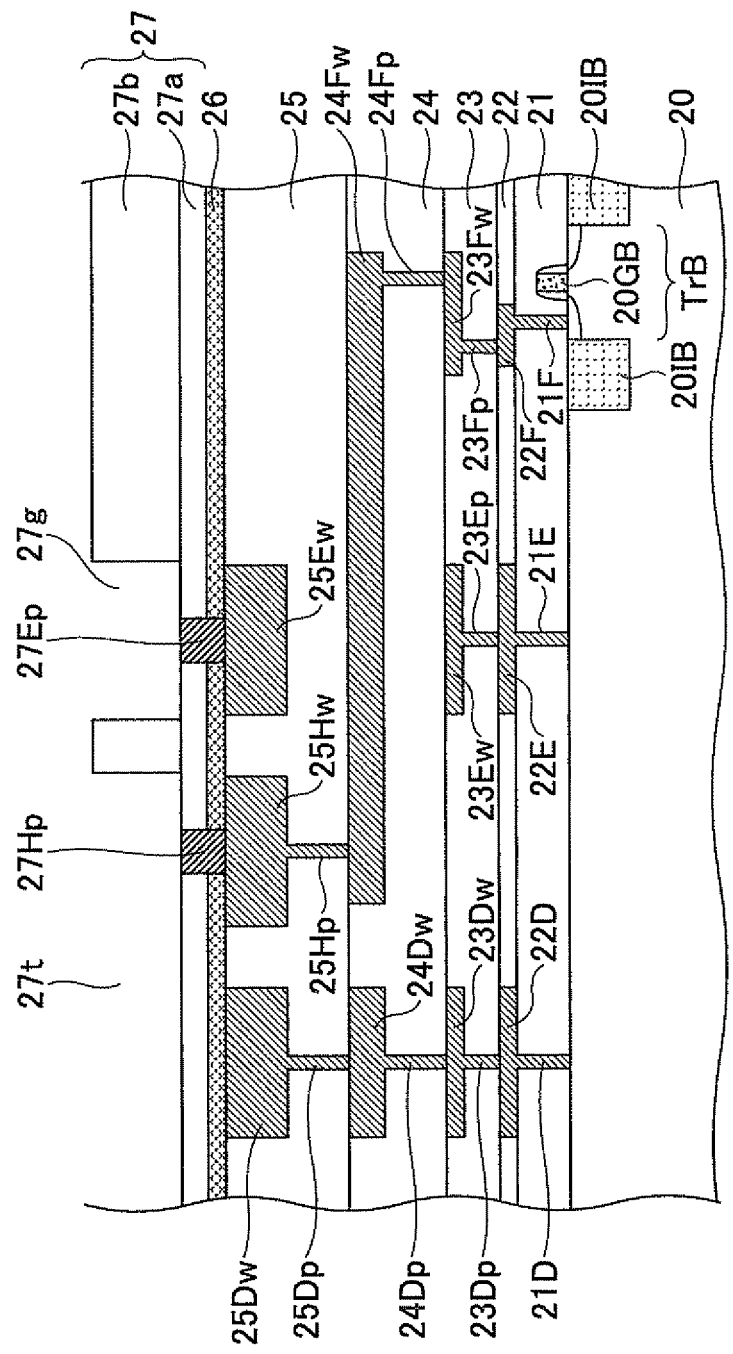
FIG. 9J is a sectional view for explaining fabrication steps of the semiconductor device in FIG. 3 and FIG. 4 (part 10)
Figure 9K:
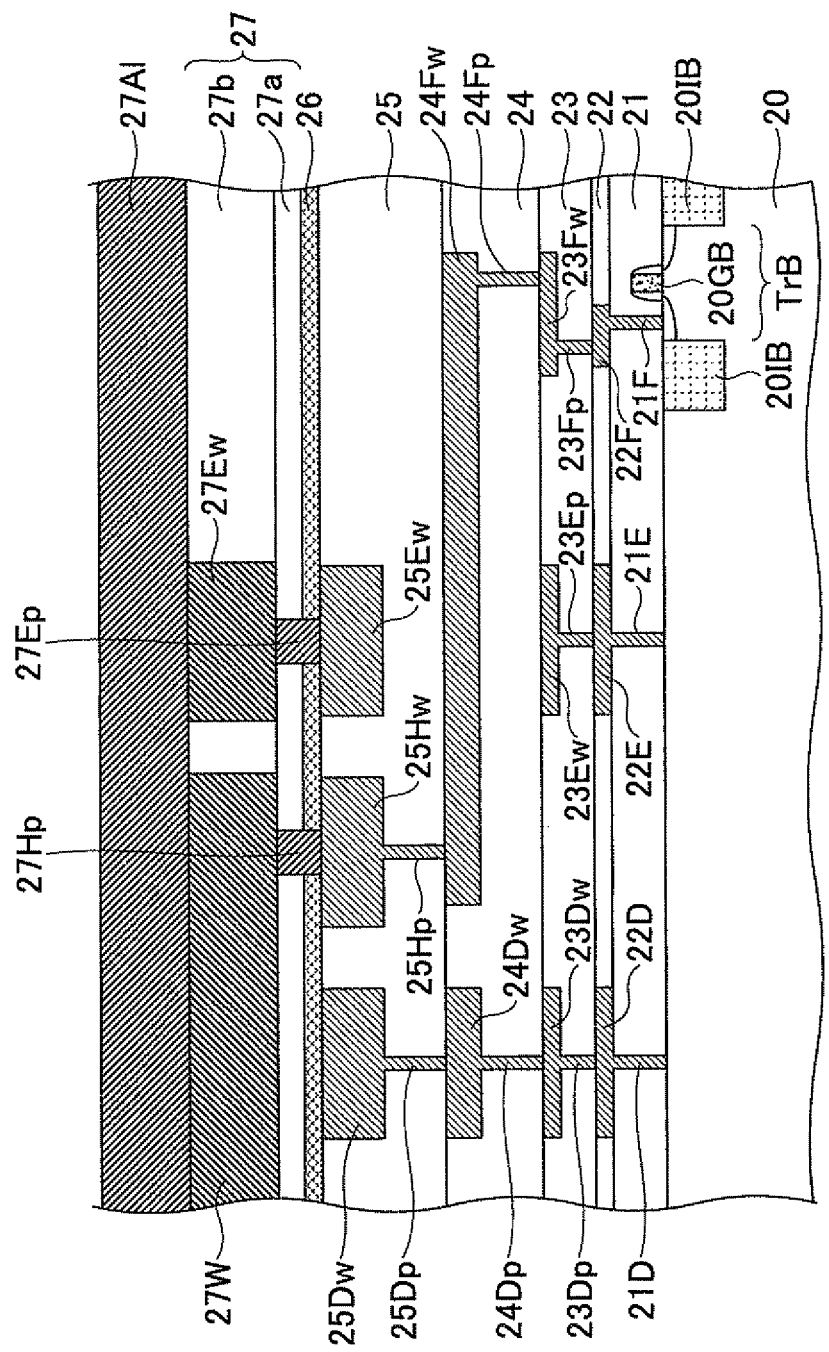
FIG. 9K is a sectional view for explaining fabrication steps of the semiconductor device in FIG. 3 and FIG. 4 (part 11)

Next, in a step in FIG. 9I, a top portion 27b of the inter-layer insulation film 27 is formed on the inter-layer insulation film 27a. Next, in a step in FIG. 9J, a wiring groove 27t corresponding to the Al wiring pattern 27W is formed, and a groove 27g corresponding to the Al pattern 27Ew is formed in the inter-layer insulation film 27b. In addition, another groove (not depicted in the sectional view in FIG. 9J) corresponding to the Al pattern 27Dw is formed. In a step in FIG. 9K, the wiring groove 27t, the groove 27g, and a further groove (not depicted in FIG. 9K) are filled up, and an Al layer 27Al is layered.

Figure 9L:
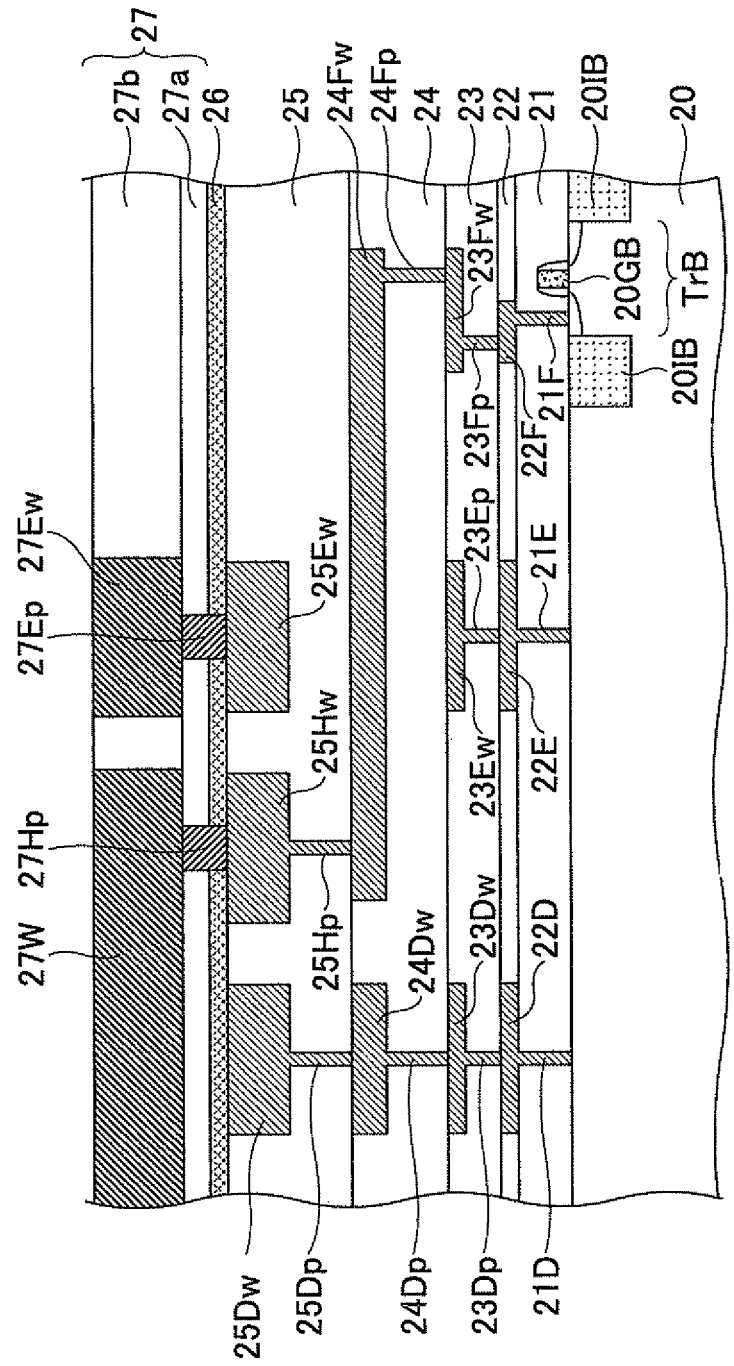
FIG. 9L is a sectional view for explaining fabrication steps of the semiconductor device in FIG. 3 and FIG. 4 (part 12)

Furthermore, in a step in FIG. 9L, in the Al layer 27Al, an excessive region of an upper portion than a top surface of the inter-layer insulation film 27b is eliminated. Then, the Al wiring pattern 27W is formed by filling up the wiring groove 27t. Also, the Al pattern 27Ew and the Al pattern 27Dw are formed by filling up the groove 27g and another groove (not depicted in FIG. 9L). As previously described, the Al pattern 27Dw is not depicted in the sectional view in FIG. 9J.

Similar steps are continuously performed, thereby the semiconductor device 100B of the sectional surface configuration in FIG. 4 is acquired.

As described above, according to the first embodiment, it is possible to form the internal circuits $IC_A$ and $IC_B$ in the element regions 121A and 121B, respectively, on the same semiconductor substrate in a state in which the internal circuits $IC_A$ and $IC_B$ are electrically connected with each other by the wiring portions 21X and 21Y. Each of the internal circuits $IC_A$ and $IC_B$ are surrounded by a double sealing and independently operate. In the semiconductor device having this configuration, by further dicing the semiconductor substrate and dividing into each of the element regions, it is possible to form the semiconductor device 100B, 100C, or the like which is integrated as needed and has a fewer number of chip regions, as illustrated in FIG. 3 and FIG. 1B.

Figure 10:
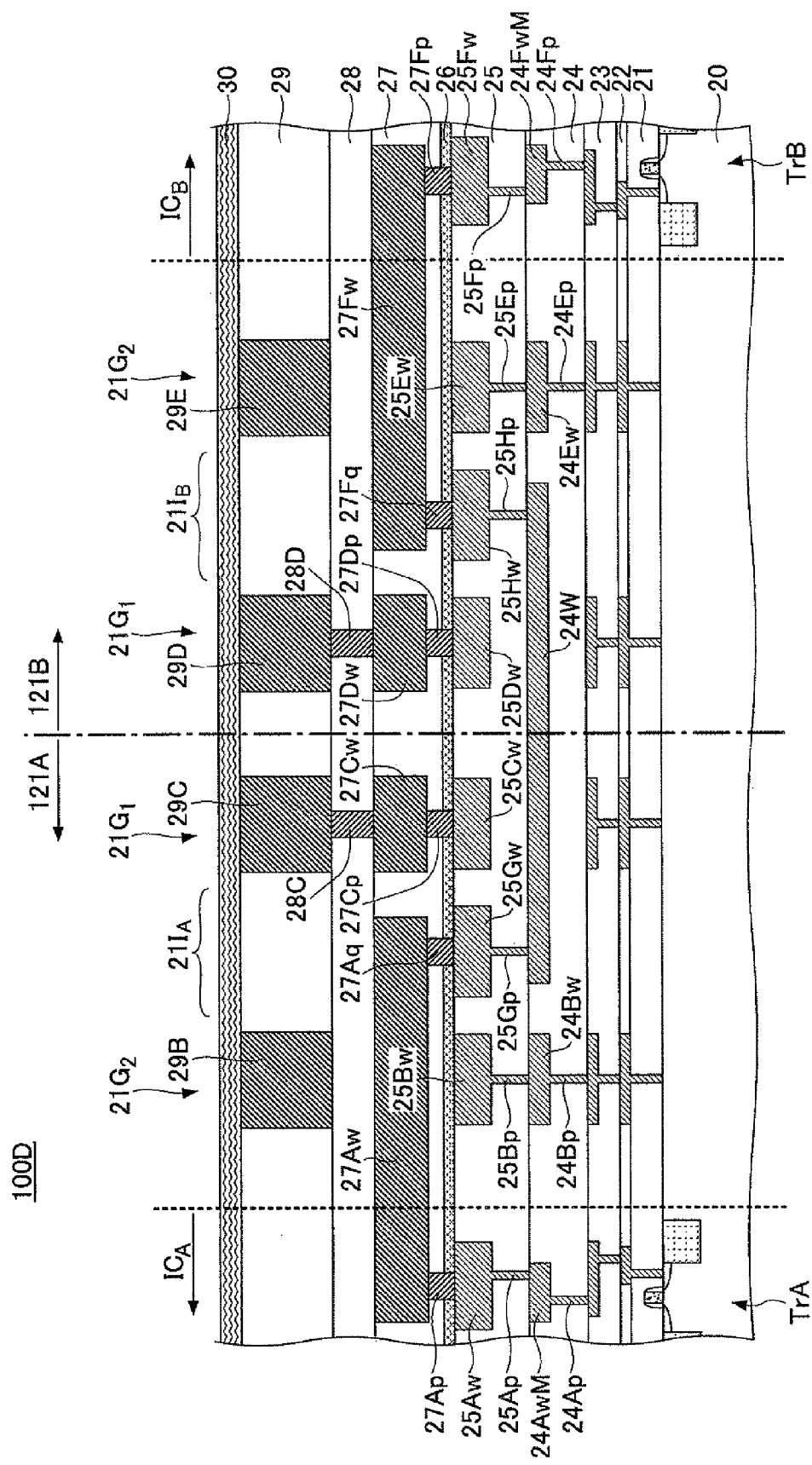
FIG. 10 is a sectional view illustrating a configuration of the semiconductor device according to a variation of the first embodiment.

FIG. 10 illustrates a semiconductor device 100D according to a variation of the semiconductor device 100B in FIG. 4. In FIG. 10, elements that are the same as those previously described are indicated by the same reference numerals and the explanation thereof will be omitted.

Referring to FIG. 10, in this variation, a connection between the first element region 121A and the second element region 121B is realized by a Cu wiring pattern 24W formed in the inter-layer insulation film 24, instead of the Al wiring pattern 27W in FIG. 4. The Al wiring pattern 27W extends from the first sealing region $21I_A$ of the element region 121A to the second sealing region $21I_B$ of the element region 121B.

Accordingly, in the first embodiment, as the Cu wiring pattern connected to the Cu via plug 24Ap in the inter-layer insulation film 24, instead of the conductive pattern 24Aw as the Cu wiring pattern in case in FIG. 4, a Cu wiring pattern 24AwM, which is limited in the internal circuit $IC_A$, is formed. A Cu wiring pattern 25Aw is further formed by corresponding to the Cu wiring pattern 24AwM in the Cu wiring pattern 25. The Cu wiring pattern 25Aw is electrically connected to the Cu wiring pattern 24AwM by a via plug 25Ap. Furthermore, an Al wiring pattern 27Aw is formed so as to extend from the internal circuit $IC_A$ to the first sealing region $21I_A$. One edge of the Al wiring pattern 27Aw is electrically contacted to the Cu wiring pattern 25Aw by a via plug 27Ap penetrating the moisture resistant film 26. Another edge of the Al wiring pattern 27Aw is electrically contacted to the Cu wiring pattern 25Gw by a via plug 27Aq penetrating the moisture resistant film 26. On the other hand, the Cu wiring pattern 25Gw is electrically contacted to one edge of the Cu wiring pattern 24W by the via plug 25Gp.

Furthermore, in the variation of the first embodiment, it is not required to form a discontinuation in the sealing $21G_2$ of the inner side at a lower portion than the moisture resistant film 26. The Cu via pattern 24Bp, the conductive pattern 24Bw, and the Cu contact 25Bp successively surround a semiconductor chip region 10A without a discontinuation, and are illustrated in the sectional view in FIG. 10.

On the other hand, in the variation of the first embodiment, discontinuations are formed to the Al via pattern 27Bp, the Al pattern 27Bw, and the Al pattern 28B by corresponding to the sectional surface illustrated in FIG. 10, in order to pass the Al wiring pattern 27Aw. Thus, in the sectional view in FIG. 10, the Al via pattern 27Bp, the Al pattern 27Bw, and the Al pattern 28B, which form the sealing $21G_2$ in the element region 121A, are not illustrated.

Also, in the variation of the first embodiment, a discontinuation may not be formed to the sealing $21G_1$ surrounding the element region 121A above the moisture resistant film 26. In the sectional view in FIG. 10, the Al contact 27Cp as the Al via pattern and the Al patterns 27Cw and 28C, which are not illustrated in FIG. 4, are depicted. It can be seen that the Al contact 27Cp penetrates the moisture resistant film 26 and contacts the Cu pattern 25Cw.

Accordingly, in the variation of the first embodiment, as the Cu wiring pattern connecting to the Cu via plug 24Fp in the inter-layer insulation film 24, instead of the conductive pattern 24Fw as the Cu wiring pattern in a case in FIG. 4, a Cu wiring pattern 24FwM limited in the internal circuit $IC_B$ is formed. The conductive pattern 25Fw as the Cu wiring pattern is further formed by corresponding to the Cu wiring pattern 24FwM in the Cu wiring pattern 25. The conductive pattern 25Fw is electrically connected to the Cu wiring pattern 24FwM by a via plug 25Fp. Morover, an Al wiring pattern 27Fw is formed so as to extend from the internal circuit $IC_B$ to the second sealing region $21I_B$ in the inter-layer insulation film 27. One edge of the Al wiring pattern 27Fw is electrically contacted to the conductive pattern 25Fw by a via plug 27Fp penetrating the moisture resistant film 26. Also, another edge of the Al wiring pattern 27Fw is electrically contacted to the Cu pattern 25Hw by a via plug 27Fq penetrating the moisture resistant film 26. On the other hand, the Cu pattern 25Hw is electrically contacted to another edge of the Cu pattern 24W by the via plug 25Hp.

Furthermore, in the variation of the first embodiment, a discontinuation may not be formed in the sealing $21G_2$ of the inner side at a lower portion than the moisture resistant film 26. Thus, the Cu via pattern 24Ep, the Cu pattern 24Ew, and the Cu contact 25Ep, which are not illustrated in the sectional view in FIG. 4, successively surround a semiconductor chip region 20B without a discontinuation, and are depicted in the sectional view in FIG. 10.

On the other hand, in the variation of the first embodiment, discontinuations are formed to the Al contact 27Ep, the Al pattern 27Ew, and the Al pattern 28E by corresponding to the sectional surface illustrated in FIG. 10, in order to pass the Al wiring pattern 27Fw. Thus, in the sectional view in FIG. 10, the Al via pattern 27Ep, the Al pattern 27Ew, and the Al pattern 28E, which form the sealing $21G_2$ in the element region 121B, are not illustrated.

Also, in the variation of the first embodiment, a discontinuation may not be formed to the sealing $21G_1$ surrounding the element region 121B above the moisture resistant film 26. Thus, in the sectional view in FIG. 10, the Al contact 27Dp, the Al pattern 27Dw, and the Al pattern 28D, which are not depicted in the sectional view in FIG. 4, are illustrated in the sectional view in FIG. 10. It can be seen that the Al contact 27Dp penetrates the moisture resistant film 26 and is contacted to the conductive pattern 25Dw.

In the variation of the first embodiment, it is not limited to a configuration as described in FIG. 4 in which the Al wiring pattern 27W is formed above the moisture resistant film 26 connecting the element region 121A and the element region 121B. As illustrated in FIG. 10, the element regions 121A and 121B may be electrically connected by the Cu wiring pattern 24W formed below the moisture resistant film 26.

Figure 11:
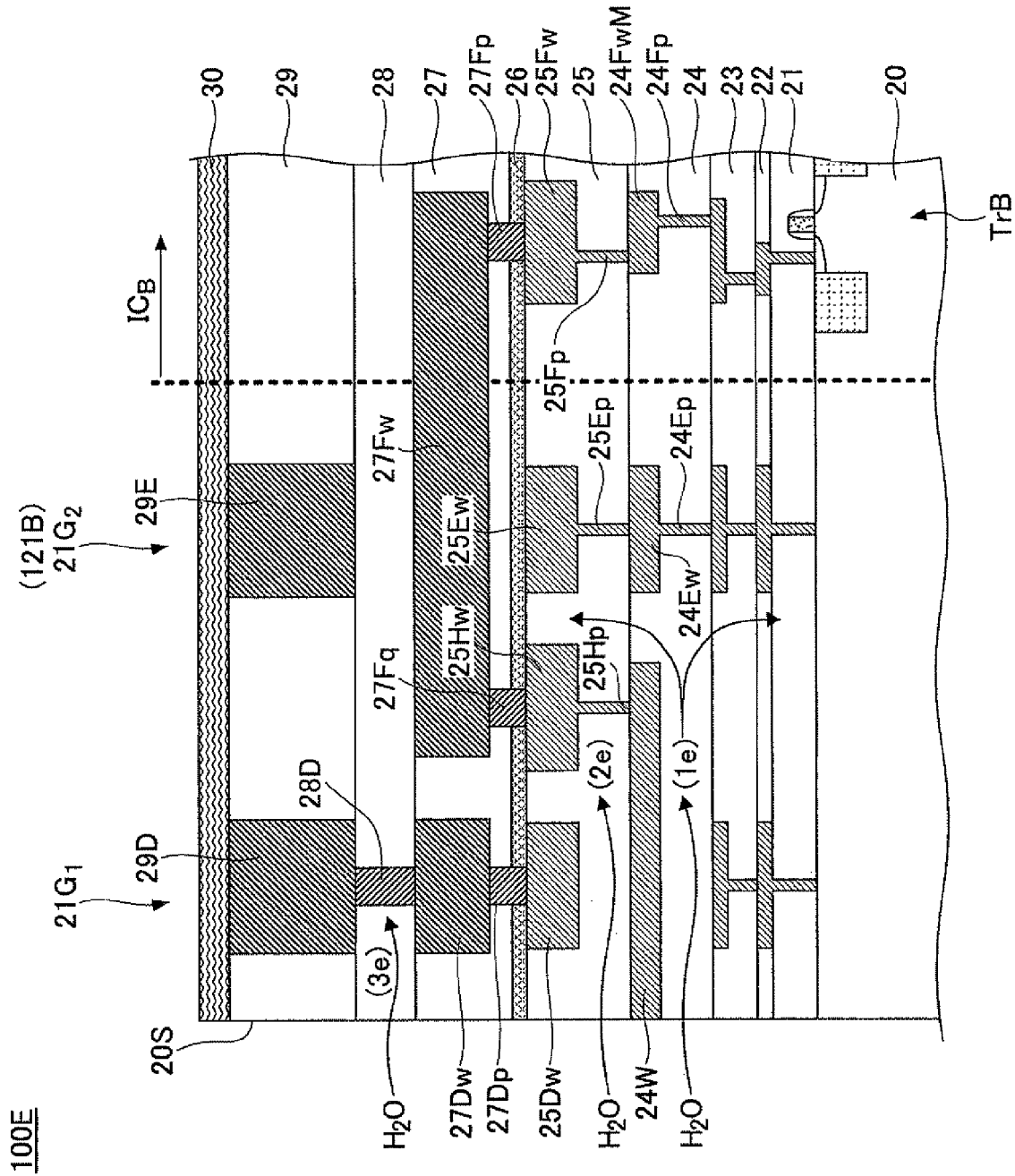
FIG. 11 is a sectional view for explaining how to prevent moisture from entering the semiconductor device in FIG. 10.

FIG. 11 is a sectional view of a semiconductor device 100E supporting the element region 121B in a case of cutting into the element regions 121A and 121B along the space region 20L corresponding to the scribe line 10L illustrated in FIG. 3 in the configuration in FIG. 10. The sectional view in FIG. 11 corresponds to the sectional view in FIG. 7. In FIG. 11, elements that are the same as those previously described are indicated by the same reference numerals and the explanation thereof will be omitted.

Referring to FIG. 11, in the semiconductor device 100E, the side wall surface 20S is exposed outside, and the Cu wiring pattern 24W is exposed on the side wall surface 20S.

In the configuration in FIG. 11, moisture $H_2O$ enters the semiconductor 100E along an interface between the Cu wiring pattern 24W and the inter-layer insulation film 24 below the Cu wiring pattern 24W at a bottom side of the moisture resistant film 26 in accordance with a path (1e). However, the moisture $H_2O$ along the path (1e) is blocked by the moisture resistant film 26 and the sealing $21G_2$ of the inner side. Thus, it is possible to prevent the moisture $H_2O$ from entering the internal circuit $IC_B$. Moreover, similarly, it is possible to block moisture $H_2O$ entering along an interface between the Cu wiring pattern 24W and the inter-layer insulation film 25 above the Cu wiring pattern 24W at a lower side of the moisture resistant film 26 in accordance with a path (2e). Furthermore, it is possible to block moisture $H_2O$ entering above the moisture resistant film 26 by the sealing $21G_1$ of the outer side.

As described above, in the variation of the first embodiment, by applying a sectional surface configuration including the moisture resistant film 26 illustrated in FIG. 10 or FIG. 11, even in a case of forming the semiconductor device 100E having a fewer number of chip regions by cutting along the space region 20L or 20M, it is possible to prevent the moisture $H_2O$ from entering the internal circuit $IC_B$ by actions of the sealing $21G_1$ and the sealing $21G_2$, which form a double sealing, and the moisture resistant film 26. A similar effect may be obtained in a case in which a semiconductor device having a configuration including a single core region is formed by dividing the semiconductor device 100A of the multi-core configuration in FIG. 10.

Second Embodiment

Figure 12:
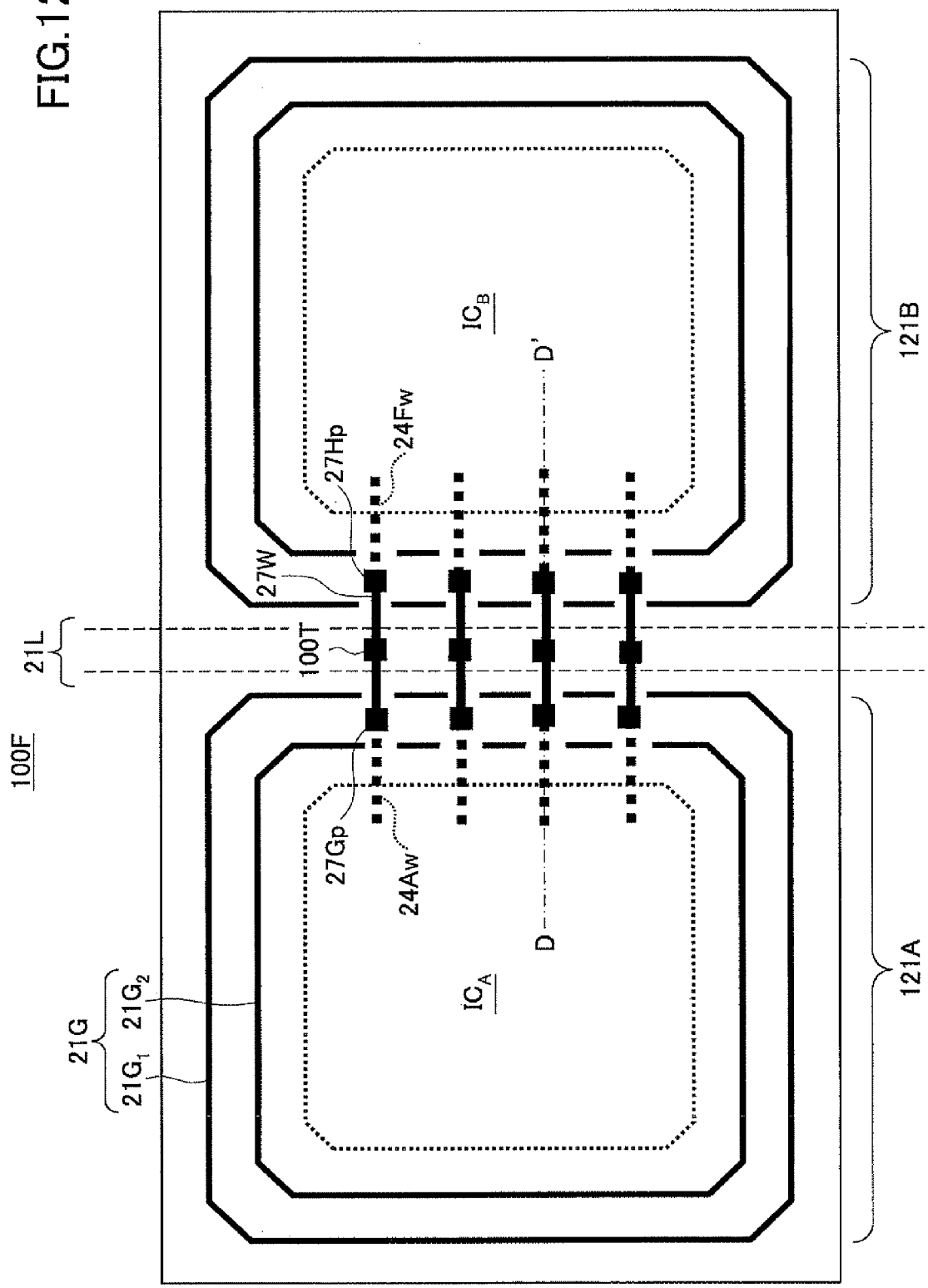
FIG. 12 is a plan view illustrating a configuration of the semiconductor device according to a second embodiment.
Figure 13:
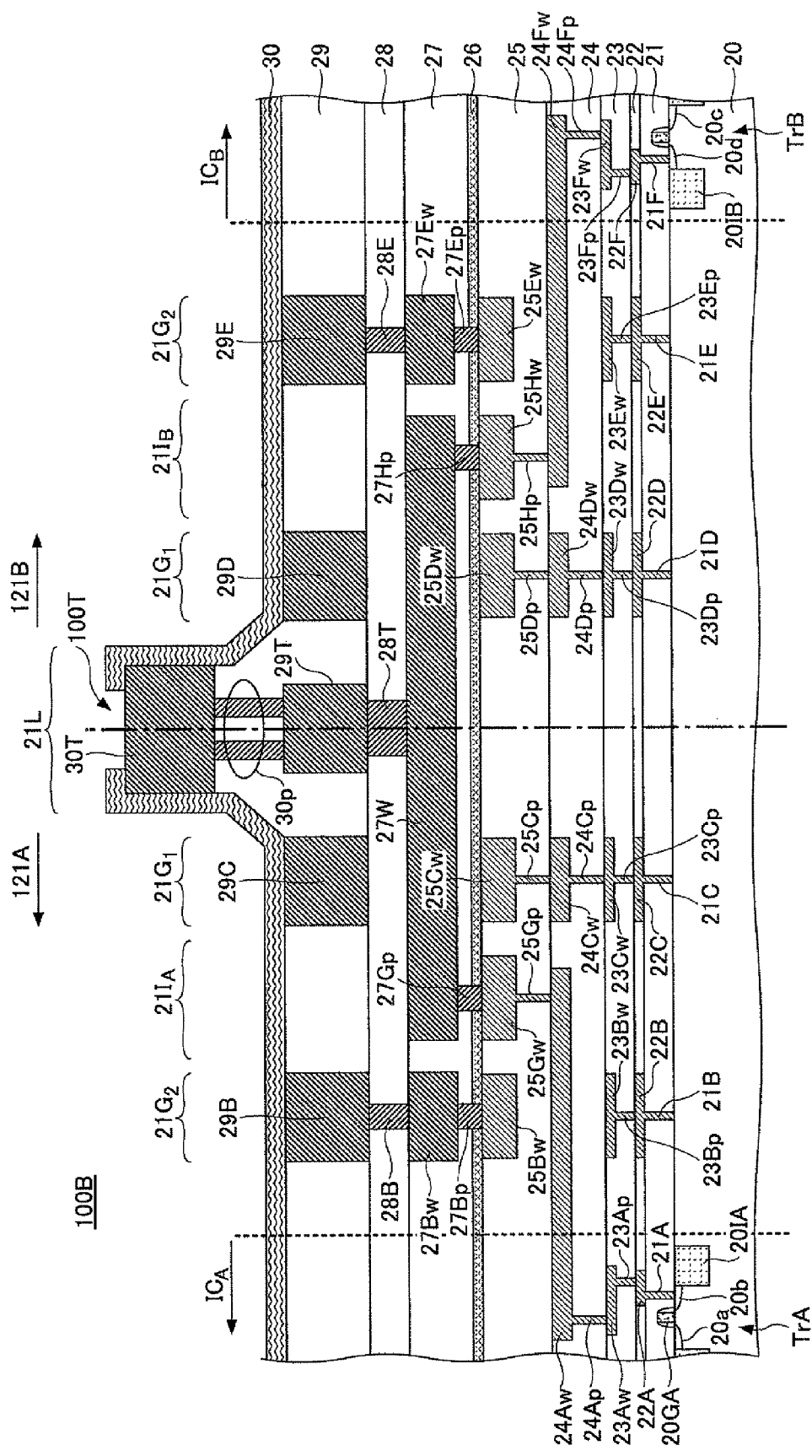
FIG. 13 is a sectional view of the semiconductor device along line D-D' in the plan view in FIG. 12.

FIG. 12 is a plan view briefly illustrating a configuration of a semiconductor device 100F according to a second embodiment. FIG. 13 is a sectional view of the semiconductor device 100F along line D-D' in the plan view in FIG. 12. In FIG. 12 and FIG. 13, elements that are the same as those previously described are indicated by the same reference numerals and the explanation thereof will be omitted.

Referring to FIG. 12 and FIG. 13, in the second embodiment, each of terminals 100T for testing the internal circuits $IC_A$ and $IC_B$ is formed in a shape of a pad electrode on a respective Al wiring pattern 27W extending from the Al via plug 27Gp in the element region 121A to a via plug 27Hp in the element region 121B.

In the second embodiment, terminals 100T for a test are formed on a scribe line 21L. Each of the terminals 100T includes an Al via plug 28T formed to contact the Al wiring pattern 27W, an electrode pad 29T formed on the Al via plug 28T, and an electrode pad 30T formed on the electrode pad 29T in the inter-layer insulation film 28. The electrode pad 30T electrically contacts a plurality of via plugs 30p below the electrode pad 30T. The plurality of via plugs 30p operate to mechanically support the electrode pad 30T in the electrode pad 29T. Also, in the second embodiment, the protection film 30 protects a side wall surface of the electrode pad 30T.

In the second embodiment, a probe of a test apparatus is contacted to each of the terminals 100T. Thus, it is possible to efficiently test the internal circuit $IC_A$ in the element region 121A and the internal circuit $IC_B$ in the element region 121B by one contact alone.

According to the second embodiment, the probe of the test apparatus is contacted to the terminals 100T. Even in a case in which the element region 121A and the element region 121B are separated by cutting along the scribe line 21L to divide into individual semiconductor chips, it is possible to effectively test the internal circuit $IC_A$ in the element region 121A and the internal Circuit $IC_B$ in the element region 121B by contacting the probe of the test apparatus to the terminals 100T once.

According to the second embodiment, the element region 121A and the element region 121B are separated by cutting along the scribe line 21L. Even in a case of dividing into individual semiconductor chips, it is possible to effectively write predetermined data to the internal circuit $IC_A$ in the element region 121A and the internal circuit $IC_B$ in the element region 121B, through the terminals 100T. In the second embodiment, the terminals 100T used to write data are eliminated in a scribe step later. Thus, it becomes difficult for a third party to read out the data written in the internal circuit $IC_A$ and the internal circuit $IC_B$.

In the second embodiment, in a case in which the element region 121A and the element region 121B are cut along the scribe line 21L to divide into the individual semiconductor chips, as previously described, it is possible to block the moisture from entering the internal circuits $IC_A$ and $IC_B$ from a cut surface.

Third Embodiment

Figure 14:
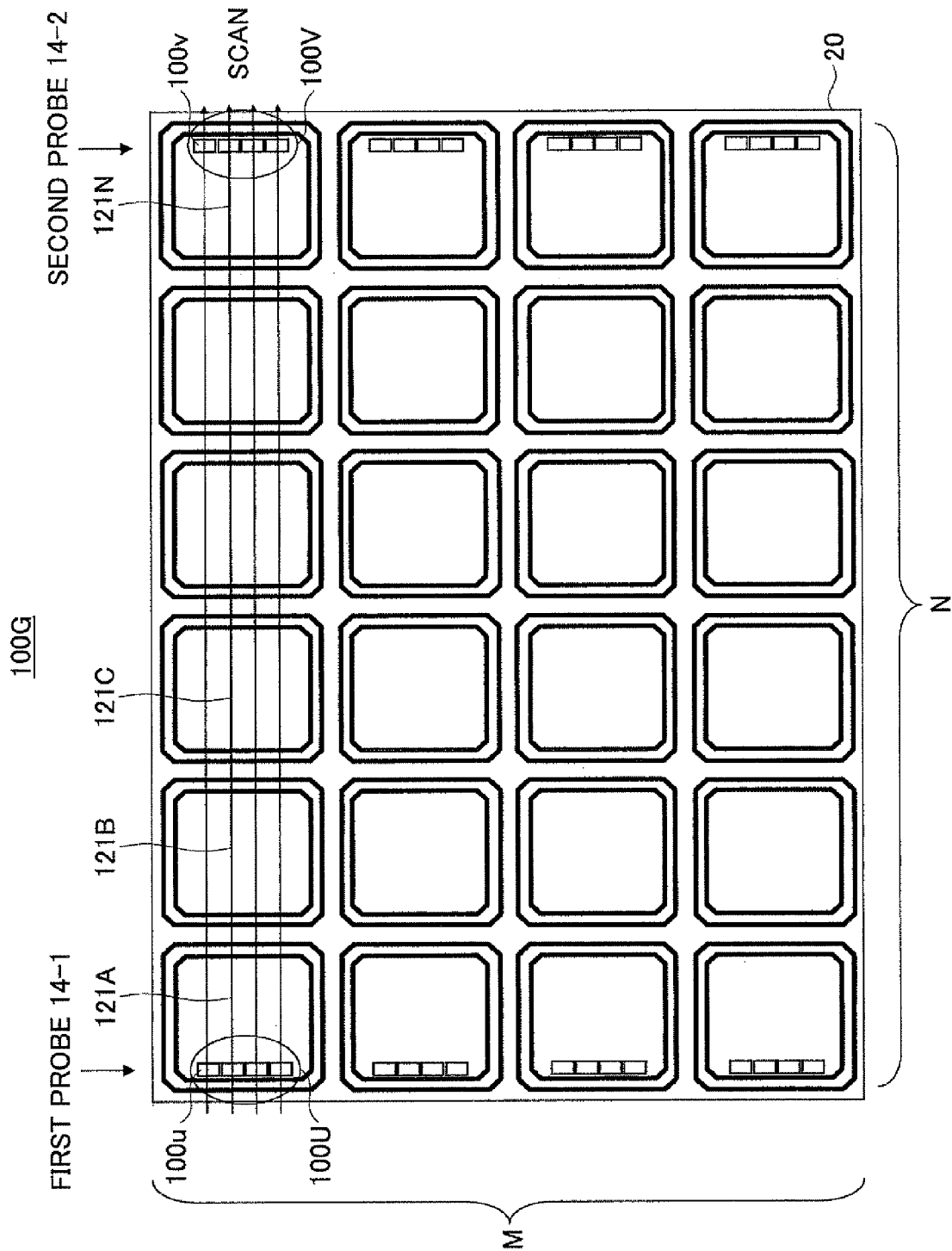
FIG. 14 is a plan view for explaining a test method of a multi-core semiconductor device according to a third embodiment.

FIG. 14 is a plan view for explaining a test method of a multi-core semiconductor device 100G according to a third embodiment. In FIG. 14, elements that are the same as those previously described are indicated by the same reference numerals and the explanation thereof will be omitted.

Referring to FIG. 14, in the third embodiment, each of element regions 121A, 121B, 121C, ..., 121N may include the sealing $21G_1$ of the outer side and the sealing $21G_2$ of the inner side, and include a single core IC as illustrated in FIG. 1B. Instead of a two-row two-column configuration in FIG. 1A, the element regions 121A, 121B, 121C, ..., 121N may be arranged by a M-row N-column configuration on a single silicon substrate 20. In the element region 121A located at a left side in each of 1 to M rows, an electrode pad 100*u* for the test similar to the electrode pad 100T is formed. Also, in the element region 121N located at a right side in each of 1 to M rows, an electrode pad 100*v* for the test similar to the electrode pad 100T is formed corresponding to the electrode pad 100*u*. The electrode pads 100*u* and 100*v* form a test terminal group 100U and a test terminal group 100V by corresponding to a plurality of the conductive patterns 24Fw and a plurality of the conductive patterns 25Fw.

In the third embodiment, at each of 1 to M rows, a first probe 14-1 is contacted to the electrode pads 100*u* forming the test terminal group 100U, and a second probe 14-2 is contacted to the electrode pads 100*v* forming the test terminal group 100V. A test signal and a region selection signal are supplied with a power voltage, a clock signal, and the like from the test terminal group 100U, and the test signal is detected by the test terminal group 100V. In this case, by the region selection signal, the element regions 121A, 121B, 121C, ..., and 121N are successively scanned and selected from left to right as indicated by arrows in FIG. 14. It is possible to successively test the element regions 121A through 121N from left to right in each of 1 to M rows.

Figure 15:
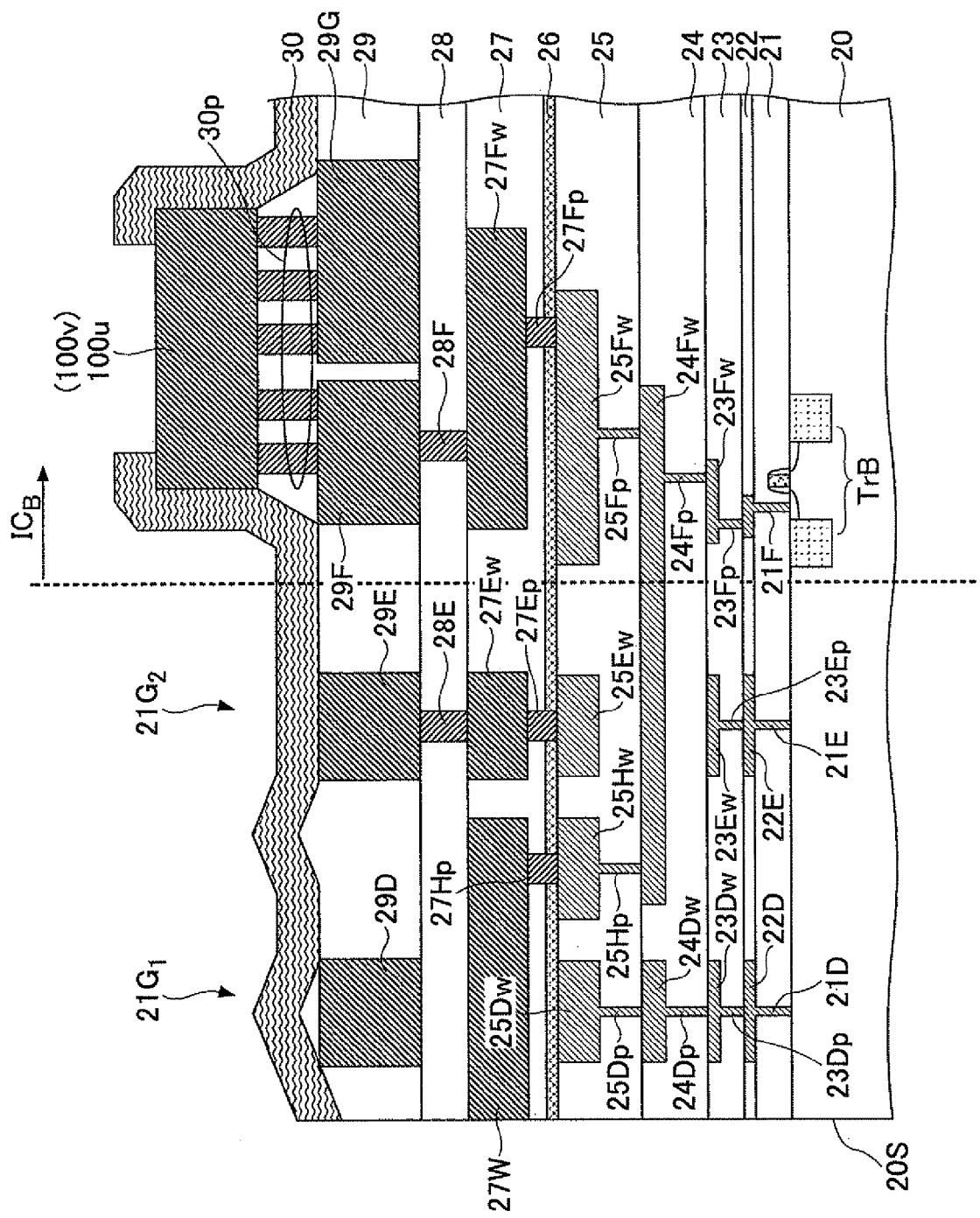
FIG. 15 is a sectional view of one of the element regions having the single core depicted in the plan view in FIG. 14, which is sectioned along a line E-E' in FIG. 16.
Figure 16:
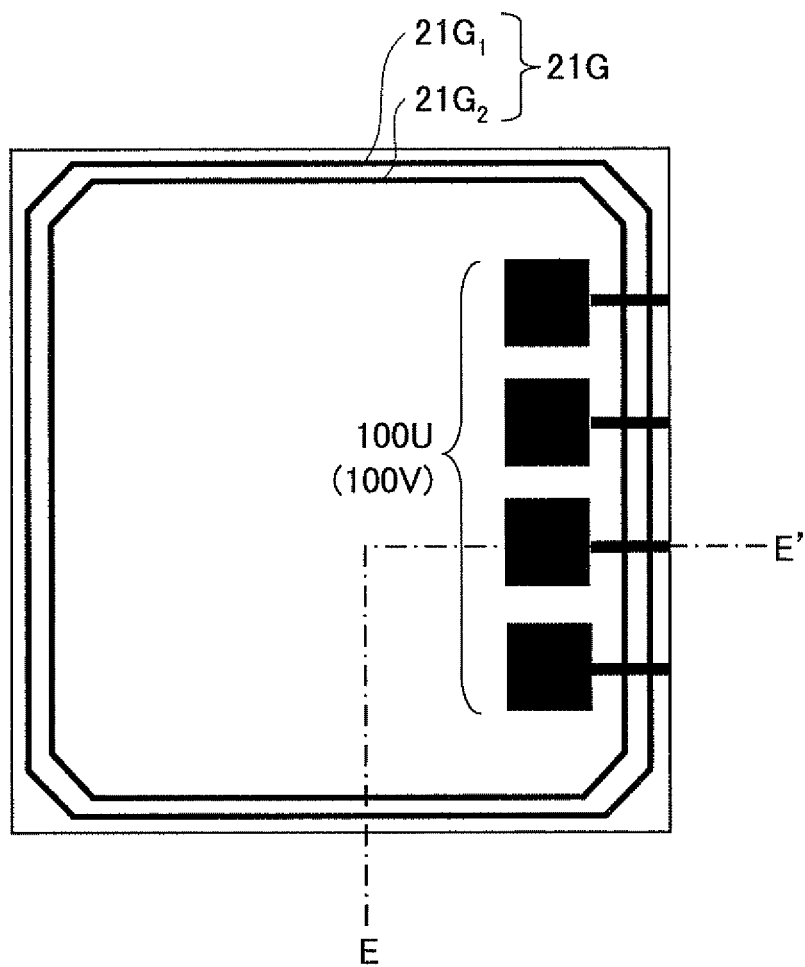
FIG. 16 is a plan view corresponding to the sectional view in FIG. 15.

FIG. 15 is a sectional view of one of the element regions having the single core depicted in the plan view in FIG. 14, which is sectioned along a line E-E' in FIG. 16.

Referring to FIG. 15, in the third embodiment, Al electrode pads 29F and 29G are formed on the inter-layer insulation film 28 immediately below the electrode pads 100*u* or 100*v*. The electrode pad 29F is electrically connected to the Al wiring pattern 27Fw formed in the inter-layer insulation film 27 through the Al via plug 28F formed in the inter-layer insulation film 28 through the plurality of via plugs 30*p* similar to the configuration in FIG. 13. On the other hand, the Al wiring pattern 27Fw is electrically connected to the conductive pattern 25Fw as the Cu wiring pattern formed in the inter-layer insulation film 25 through the via plug 27Fp penetrating the moisture resistant film 26. The conductive pattern 25Fw is electrically connected to the conductive patterns 24Fw through the via plug 25Fp formed in the inter-layer insulation film 25.

It is apparent that a scan of the element regions 121A through 121N may be conducted from right to left in an arrangement in FIG. 14.

In the configuration in the third embodiment, it is possible to access the transistor TrB forming a part of the internal circuit $IC_B$, through the test terminal group 100U or 100V.

Fourth Embodiment

The semiconductor device 100G, which is depicted in the plan view in FIG. 14 previously described, corresponds to a reticle region 10Ret (FIG. 17) in a semiconductor wafer 10 illustrated in a plan view in FIG. 17 which will be described later. The reticle region 10Ret is regarded as a range exposed by one reticle.

Accordingly, by performing the scan described with reference to FIG. 14 for the entire semiconductor wafer 10 as indicated by the arrows in FIG. 17, it is possible to efficiently test each of semiconductor devices of the multi-core configuration or the single core configuration at a stage prior to dicing.

Figure 17:
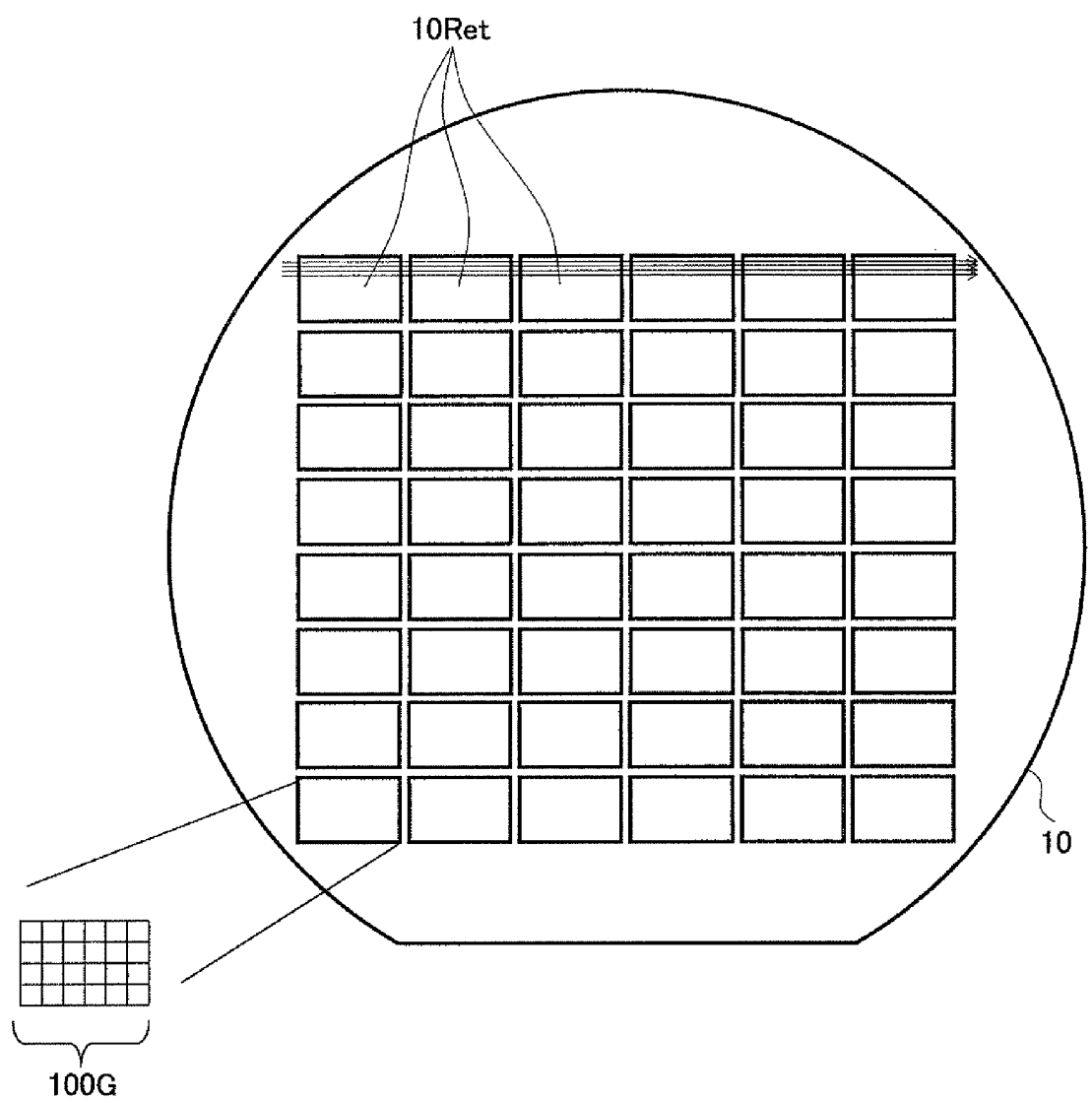
FIG. 17 is a plan view for explaining a test method according to a fourth embodiment.

In this test, in FIG. 17, the test terminal group 100U as illustrated in FIG. 14 and FIG. 15 is formed at a left side of the element region of the reticle region 10Ret to be a starting point of the scan at the left most in each of rows. Also, the test terminal group 100V as illustrated in FIG. 14 and FIG. 15 is formed at a right side of the element region of the reticle region 10Ret to be an end point of the scan at the right most in each of rows. The test signal and the selection signal are supplied to the test terminal group 100U with the power voltage, the clock signal, and the like from the first probe 14-1. The test signal is detected at the test terminal group 100V by using the second probe 14-2.

It is apparent that the scan of the element regions may be conducted from the right side to the left side in the arrangement in FIG. 17.

In the testing method in FIG. 17, the scan may not always be performed for each of the rows. By forming the first probe 14-1 and the second probe 14-2 for each of the rows, it is possible to simultaneously perform the scan for all rows.

Fifth Embodiment

Figure 18:
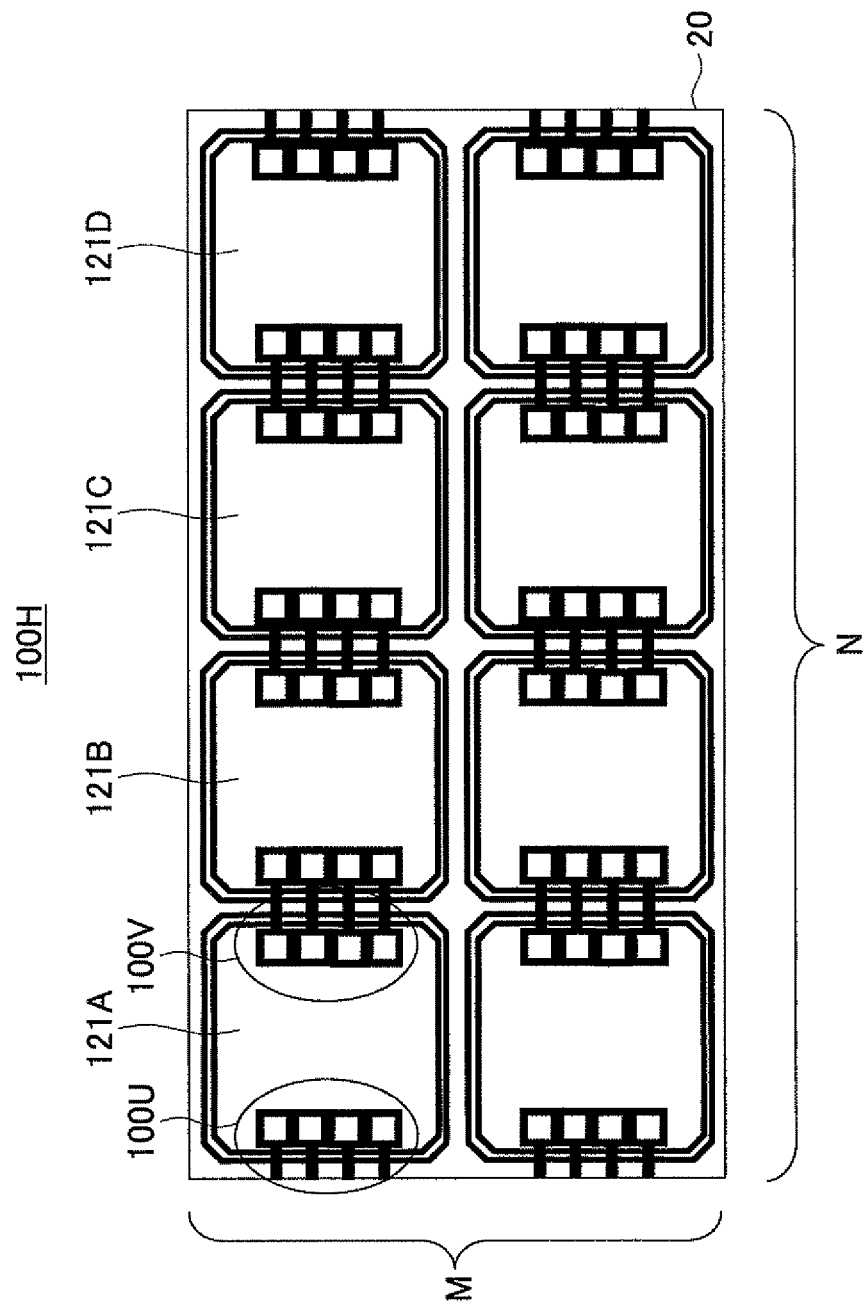
FIG. 18 is a plan view illustrating a multi-core semiconductor device according to a fifth embodiment.

FIG. 18 is a plan view illustrating a configuration of a semiconductor device 100H according to a fifth embodiment.

Referring to FIG. 18, in the fifth embodiment, the element regions 121A, 121B, 121C, and 121D may be arranged in a two-row four-column configuration on the single silicon substrate 20. Each of the element regions 121A, 121B, . . . may include the sealing $21G_1$ of the outer side and the sealing $21G_2$ of the inner side as illustrated in FIG. 1B. In each of the element regions 121A, 121B, 121C, and 121D, the test terminal group 100U similar to the electrode pad 100T is formed at a left side, and the test terminal group 100V similar to the electrode pad 100T is formed at a right side.

By this configuration, in a case of testing the element regions 121A, 121B, 121C, and 121D which are arranged in a matrix as illustrated in FIG. 14 or FIG. 17 by sequentially selecting in a row direction, even if there is a defective element region in the matrix, it is possible to perform a desired test from the element region 121A prior to the defective element region, by contacting the first probe 14-1 to the test terminal group 100U of the element region 121A at the left edge in each of rows and contacting the second probe 14-2 to the test terminal group 100V of the element region prior to the defective element region. Also, by contacting the first probe 14-1 to the test terminal group 100U of a next element region from the defective element region and contacting the second probe 14-2 to the test terminal group 100V at the right edge of the next element region, it is possible to sequentially perform the desired test.

Sixth Embodiment

Figure 19:
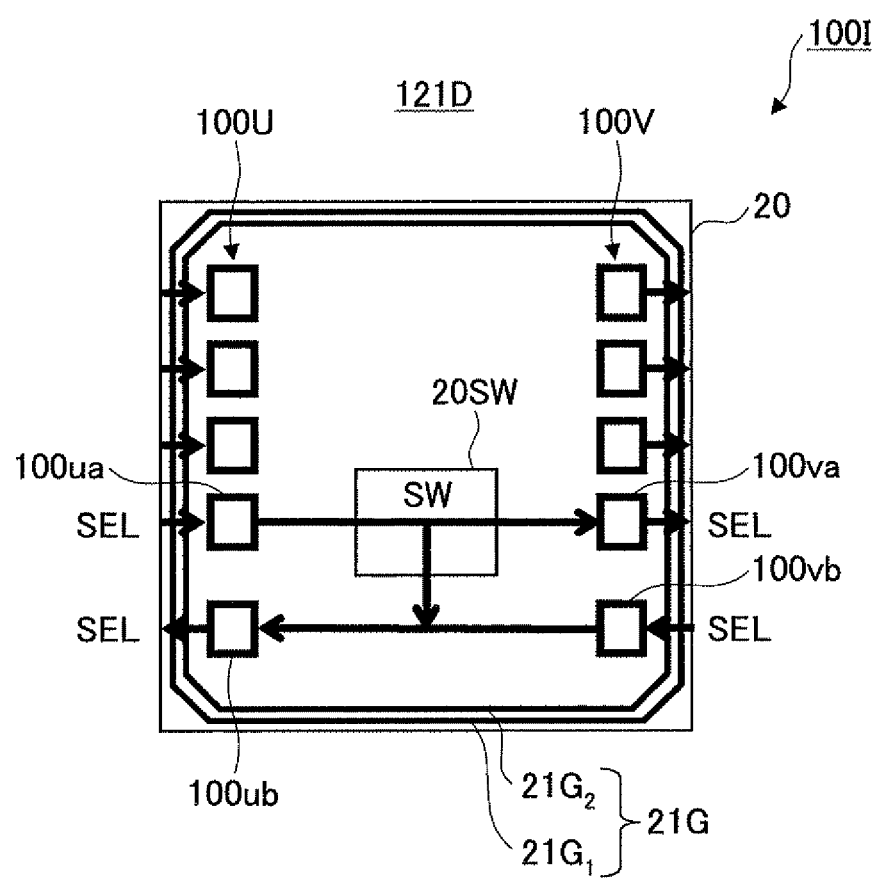
FIG. 19 is a plan view for explaining one of element regions used in a test method of a multi-core semiconductor device according to a sixth embodiment.

FIG. 19 is a plan view illustrating one of the element regions, which may be the element region 121D at the left edge of the arrangement as depicted in FIG. 18, in a semiconductor device 100I in a sixth embodiment.

Referring to FIG. 19 the test terminal group 100U is formed at the left edge of the element region 121D and the test terminal group 100V is formed at the right edge of the element region 121D in the sixth embodiment. The test terminal group 100U includes an electrode pad 100*ua* to which a selection signal SEL is supplied, and the test terminal group 100V includes an electrode pad 100*va* which outputs the selection signal SEL. Furthermore, the test terminal group 100V includes an electrode pad 100*vb* to which the selection signal is supplied, and the test terminal group 100U includes an electrode pad 100*ub* which outputs the selection signal SEL.

Furthermore, in the element region 121D in FIG. 19, a switch 20SW is formed to supply the selection signal supplied to the electrode pad 100*ua* to the electrode pad 100*va* or 100*ub*. When the switch 20SW is in a first state, the selection signal SEL, which is supplied to the electrode pad 100*ua*, is directly transmitted to the electrode pad 100*va*. However, when the switch 20SW is in a second state, the selection signal SEL, which is supplied to the electrode pad 100*ua*, is transmitted to the electrode pad 100*ub*.

Figure 20A:
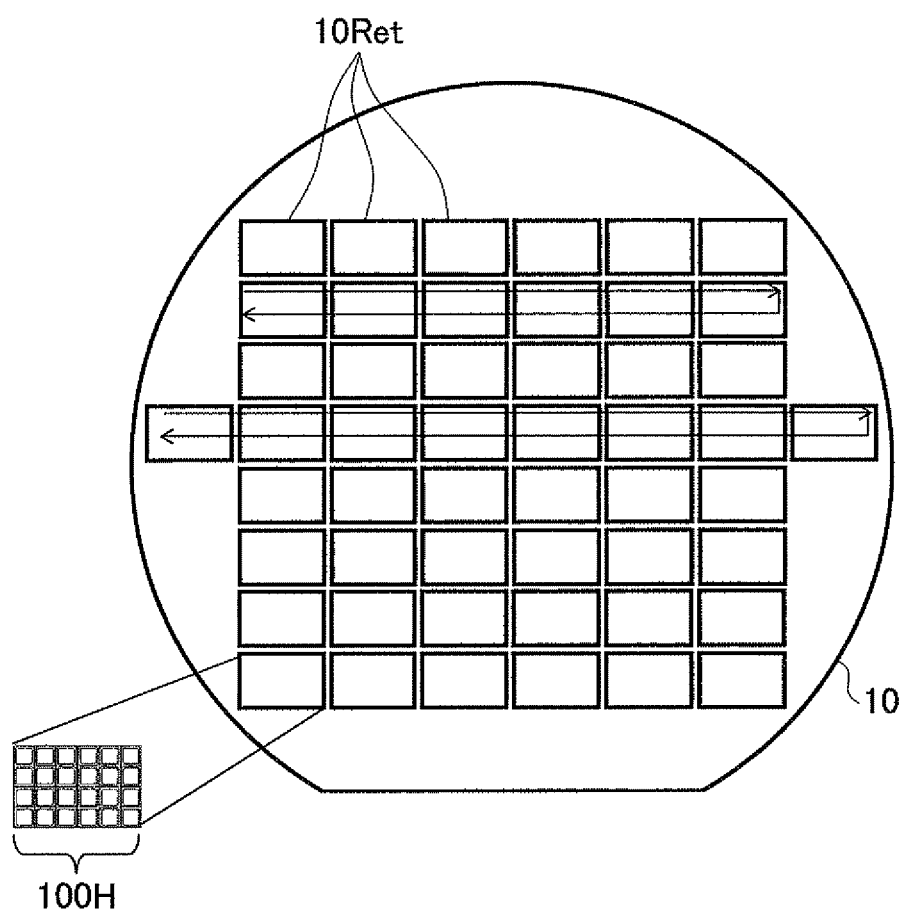
FIG. 20A is a diagram for explaining a test method using the element region in FIG. 19.
Figure 20B:
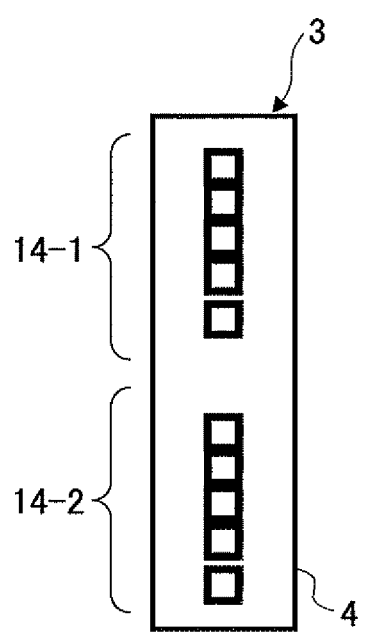
FIG. 20B is a plan view illustrating a probe used for the test method in FIG. 20A.

The switch 20SW described above is formed on the element region 121D at the left edge of the arrangement in FIG. 18, and a state of the switch 20SW is set to the second state. By this state setting, as illustrated in FIG. 20A, it is possible to turn over a direction of scanning from left to right at the right edge of the arrangement from right to left in a case of testing the element regions. In this case, as illustrated in FIG. 20B, the first probe 14-1 and the second probe 14-2 may be fixed at the right edge of the arrangement of the reticle regions 10Ret at each of rows on a base 4. A probe apparatus 3 having this configuration is contacted. Accordingly, it is possible to perform a desired test without contacting probes at the right edge and the left edge of the arrangement.

The above described configuration is useful in a case in which a column number in the arrangement of the element regions on the wafer 10 as illustrated in FIG. 2 or FIG. 20A, that is, if a distance between the probe 14-1 and the probe 14-2 is changed depending on the row in the arrangement of the element regions.

Seventh Embodiment

Figure 21A:
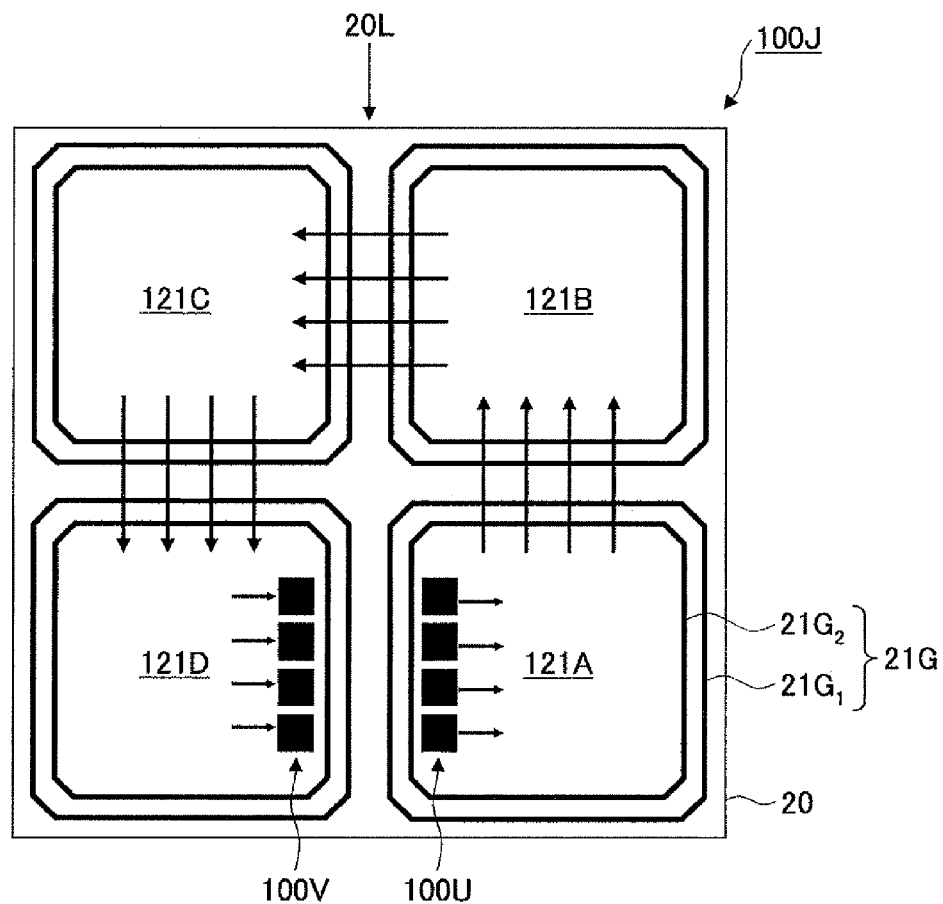
FIG. 21A is plan view for explaining a test method of a multi-core semiconductor device according to a seventh embodiment.

FIG. 21A is a diagram for explaining a test method of a multi-core semiconductor device 100J in a seventh embodiment. In FIG. 21A, elements that are the same as those previously described are indicated by the same reference numerals and the explanation thereof will be omitted.

Referring to FIG. 21A, in the multi-core semiconductor device 100J in the seventh embodiment, on the single silicon substrate 20, the element regions 121A, 121B, 121C, and 121D may be arranged in a four-row four-column configuration. Each of the element regions 121A, 121B, 121C, and 121D includes the single core IC having the sealing $21G_1$ of the outer side and the sealing $21G_2$ of the inner side illustrated in FIG. 1B. The element region 121A is adjacent to the element regions 121B and 121D. The element regions 121A, 121B, and 121C are mutually connected by the wiring portions 21X, 21Y, and the like which forms the wiring pattern previously described in FIG. 4 and the like. Also, the element region 121C is adjacent to the element regions 121B and 121D, and is mutually connected by the wiring portions 21X, 21Y, and the like. The element region 121A has a diagonal relationship with the element region 121C. The element regions 121A and 121C are not mutually connected by the wiring portions 21X, 21Y, and the like. Also, the element region 121B has a diagonal relationship with the element region 121D. The element regions 121B and 121D are not mutually connected by the wiring portions 21X, 21Y, and the like.

In the seventh embodiment, the test terminal group 100U is formed at a left side in the element region 121A in FIG. 21A. On the other hand, the test terminal group 100V is formed at a right side in the element region 121D in FIG. 21A. That is, the test terminal group 100U and the test terminal group 100V face each other and sandwich the space region 20L formed between them, on the silicon substrate 20.

In the multi-core semiconductor device 100J having the above described configuration, the test is started by using the test terminal group 100U, and the element regions 121A, 121B, 121C, and 121D are sequentially selected and tested. Also, in the seventh embodiment, a test signal indicating a test result is detected by the test terminal group 100V formed on the element region 121D.

In the multi-core semiconductor device 100J in the seventh embodiment, a position relationship between the test terminal group 100U and the test terminal group 100V is not changed.

Figure 21B:
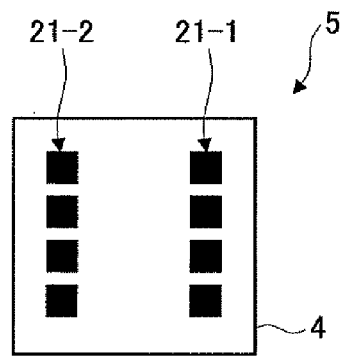
FIG. 21B is a plan view illustrating a probe used for the test method in FIG. 21A.

Accordingly, in the seventh embodiment, as illustrated in FIG. 21B, it is possible to simply conduct the test described with reference to FIG. 21A, by using a probe apparatus 5 which forms probe electrodes 21-1 corresponding to the test terminal group 100U and probe electrodes 21-2 corresponding to the test terminal group 100V on the base 4. The probe electrodes 21-1 and the probe electrodes 21-2 are used for VDD, VSS, SI, SO, EN, CLK, and the like.

As described above, the inter-layer insulation films 21 to 29 are made by silicon oxide films in which the TEOS is used as material. However, in each of the first to seventh embodiments, the material is not limited to this specific material, and other insulation films such as Low-K material or the like may be used.

Furthermore, as described above, the wiring layers to be formed in the inter-layer insulation films 21 to 25 are made from Cu, and the wiring layers to be formed in the inter-layer insulation films 27 to 29 are made from Al. In each of the first to seventh embodiments, the material is not limited to Cu for the inter-layer insulation films 21 to 25. Alternatively, all wiring layers may be formed by Cu or all wiring layers may be formed by Al. Also, other wiring material such as Tungsten (W) may be used.

According to one aspect of each of the first to seventh embodiments, it is possible to effectively block the moisture from entering an individual unit or chip, for the multi-core semiconductor device which has a configuration in which the individual unit or chip operates as an independent semiconductor device even in a case of dividing into a smaller unit or chip.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
   a semiconductor substrate configured to include an element region;
   an inner sealing configured to be formed on the element region, and to include a first opening part;
   an outer sealing configured to be formed on the element region, and to include a second opening part;
   a multilayer interconnection structure configured to be formed on the semiconductor substrate and to stack multiple inter-layer insulation films each including a wiring layer;
   a moisture resistant film configured to be formed between a first insulation film and a second insulation film formed above the first insulation film, in which the first insulation film and the second insulation film are included in the multilayer interconnection structure; and
   a wiring pattern configured to include a first portion, a second portion, and a via plug,
      wherein the first portion extends at a first side corresponding to either one of a bottom side and a top side of the moisture resistant film, and passes the first opening part;
      the second portion extends at a second side corresponding to another one of the bottom side and the top side of the moisture resistant film, and passes through the second opening part; and
      the via plug penetrates the moisture resistant film and connects the first portion and the second portion.

2. The semiconductor device as claimed in claim 1, wherein the first opening part is formed on a first wiring layer on which the first portion of the wiring pattern is formed, and on wiring layers above and below the first wiring layer, in first multiple wiring layers forming the inner sealing; and
   the second opening part is formed on a second wiring layer on which the second portion of the wiring pattern is formed, and on wiring layers above and below the second wiring layer, in second multiple wiring layers forming the outer sealing.

3. The semiconductor device as claimed in claim 1, wherein the outer sealing extends to successively surround the inner sealing at the first side of the moisture resistant film, and the inner sealing successively extends to surround an internal circuit.

4. A semiconductor device comprising:
   a semiconductor substrate on which at least a first element region and a second element region are formed;
   a first outer sealing and a first inner sealing configured to be formed on the first element region;
   a second outer sealing and a second inner sealing configured to be formed on the second element region;
   a first core region configured to be surrounded by the first inner sealing in the first element region;
   a second core region configured to be surrounded by the second inner sealing in the second element region; and
   a multilayer interconnection structure configured to be formed by a laminate which stacks multiple inter-layer insulation films extending from the first element region to the second element region on the semiconductor substrate, each of the multiple inter-layer insulation films including a wiring layer;
   wherein the multilayer interconnection structure includes a first multilayer interconnection structure portion on the first element region and a second multilayer interconnection structure portion on the second element region;
   the first multilayer interconnection structure portion includes the first outer sealing and the first inner sealing which are formed outside the first core region;
   the second multilayer interconnection structure portion includes the second outer sealing and the second inner sealing which are formed outside the second core region;
   the wiring layer forms the first outer sealing and the first inner sealing in the first multilayer interconnection structure portion;
   the wiring layer forms the second outer sealing and the second inner sealing in the second multilayer interconnection structure portion;
   the multilayer interconnection structure includes a moisture resistant film extending from the first element region to the second element region; and
   a mutual connection wiring pattern extends by sequentially crossing the first inner sealing, the first outer sealing, the second outer sealing, and the second inner sealing from the first core region,
      wherein the mutual connection wiring pattern includes:
      a first portion in which either one of a bottom side and a top side of the moisture resistant film extends from the first core region to a first sealing region between the first inner sealing and the first outer sealing;
      a second portion in which either one of the bottom side and the top side of the moisture resistant film extends from the first sealing region to a second sealing region between the second outer sealing and the second inner sealing; and
      a third portion in which the first side of the moisture resistant film extends from the second sealing region to the second core region,
      wherein the first portion and the second portion of the mutual connection wiring pattern are connected by a first via plug penetrating the moisture resistant film in the first sealing region, and
      the second portion and the third portion of the mutual connection wiring pattern are connected by a second via plug penetrating the moisture resistant film in the second sealing region.

5. The semiconductor device as claimed in claim 4, wherein
- the first portion of the mutual connection wiring pattern passes a disconnection of the first inner sealing and extends from the first core region to the first sealing region;
- the second portion of the mutual connection wiring pattern passes a disconnection of the first outer sealing and a disconnection of the second outer sealing from the first sealing region to the second sealing region; and
- the third portion of the mutual connection wiring pattern passes a disconnection of the second inner sealing region and extends from the second outer sealing region to the a second internal circuit in the second element region.

6. The semiconductor device as claimed in claim 4, wherein the first outer sealing successively extends to surround the first inner sealing at the first side of the moisture resistant film, the first inner sealing successively extends at an inner side of the first outer sealing at the second side of the moisture resistant film, the second outer sealing successively extends to surround the second inner sealing at the first side of the moisture resistant film, and the second inner sealing successively extends at an inner side of the second outer sealing at the second side of the moisture resistant film.

7. The semiconductor device as claimed in claim 1, wherein the moisture resistant film is selected from a group including an aluminum oxide film, and a silicon nitride film.

8. The semiconductor device as claimed in claim 4, wherein the first element region and the second element region are adjacent to each other via a scribe line.

\* \* \* \* \*